(12) United States Patent
Onal et al.

(10) Patent No.: US 10,971,645 B2
(45) Date of Patent: Apr. 6, 2021

(54) CONTROLLING DETECTION TIME IN PHOTODETECTORS

(71) Applicant: Waymo LLC, Mountain View, CA (US)

(72) Inventors: Caner Onal, Palo Alto, CA (US); Simon Verghese, Mountain View, CA (US); Pierre-Yves Droz, Los Altos, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

(21) Appl. No.: 16/656,891

(22) Filed: Oct. 18, 2019

(65) Prior Publication Data

US 2020/0052144 A1  Feb. 13, 2020

Related U.S. Application Data

(62) Division of application No. 15/939,619, filed on Mar. 29, 2018, now Pat. No. 10,490,687.
(Continued)

(51) Int. Cl.
*H01L 31/107* (2006.01)
*H01L 31/0352* (2006.01)
(Continued)

(52) U.S. Cl.
CPC ........ *H01L 31/107* (2013.01); *H01L 27/1443* (2013.01); *H01L 31/035272* (2013.01);
(Continued)

(58) Field of Classification Search
CPC ... G01S 7/4868; G01S 7/4876; H01L 31/107; H01L 31/186; H01L 31/035281; H01L 27/1443; H01L 31/035272
See application file for complete search history.

(56) References Cited

U.S. PATENT DOCUMENTS 3,534,231 A    10/1970  Biard
3,979,604 A *   9/1976  Bate .................... H01L 27/1446
                                              377/63
(Continued)

FOREIGN PATENT DOCUMENTS

WO    2011083657 A1    7/2011

OTHER PUBLICATIONS

International Search Report and Written Opinion from International Application No. PCT/US2019/014927, dated May 16, 2019.
(Continued)

*Primary Examiner* — Thanh Y. Tran
(74) *Attorney, Agent, or Firm* — McDonnell Boehnen Hulbert & Berghoff LLP

(57) ABSTRACT

Example embodiments relate to controlling detection time in photodetectors. An example embodiment includes a device. The device includes a substrate. The device also includes a photodetector coupled to the substrate. The photodetector is arranged to detect light emitted from a light source that irradiates a top surface of the device. A depth of the substrate is at most 100 times a diffusion length of a minority carrier within the substrate so as to mitigate dark current arising from minority carriers photoexcited in the substrate based on the light emitted from the light source.

15 Claims, 20 Drawing Sheets

Related U.S. Application Data

(60) Provisional application No. 62/623,388, filed on Jan. 29, 2018.

(51) Int. Cl.
  *H01L 31/18* (2006.01)
  *H01L 27/144* (2006.01)
  *G01S 7/486* (2020.01)
  *G01S 7/4863* (2020.01)

(52) U.S. Cl.
  CPC .... *H01L 31/035281* (2013.01); *H01L 31/186* (2013.01); *G01S 7/4863* (2013.01); *G01S 7/4868* (2013.01)

(56) References Cited

U.S. PATENT DOCUMENTS

| | | | |
|---|---|---|---|
| 4,046,609 A | | 9/1977 | Digoy |
| 4,479,139 A | * | 10/1984 | Parrish ............. H01L 29/76808 257/226 |
| 4,649,408 A | | 3/1987 | Sekine et al. |
| 4,791,467 A | * | 12/1988 | Amingual ............. H01L 31/101 257/183.1 |
| 5,654,578 A | | 8/1997 | Watanabe |
| 5,783,838 A | | 7/1998 | Kyozuka et al. |
| 6,104,047 A | | 8/2000 | Watanabe |
| 6,515,315 B1 | | 2/2003 | Itzler et al. |
| 6,906,358 B2 | | 6/2005 | Grein et al. |
| 8,203,195 B2 | | 6/2012 | Ivanov et al. |
| 8,835,979 B1 | | 9/2014 | De Lyon et al. |
| 10,490,687 B2 | * | 11/2019 | Onal .................... G01S 7/4876 |
| 2004/0188694 A1 | | 9/2004 | Lin et al. |
| 2007/0200141 A1 | | 8/2007 | Ishibashi et al. |
| 2008/0001179 A1 | * | 1/2008 | Roy ................. H01L 27/14627 257/228 |
| 2009/0261442 A1 | | 10/2009 | Grein et al. |
| 2010/0102368 A1 | * | 4/2010 | Matsushima ..... H01L 27/14632 257/293 |
| 2010/0282310 A1 | | 11/2010 | Tsoi et al. |
| 2011/0102393 A1 | * | 5/2011 | Tanaka ................. G06F 3/0412 345/207 |
| 2012/0126286 A1 | | 5/2012 | Na et al. |
| 2013/0062502 A1 | | 3/2013 | Kautzsch |
| 2013/0286718 A1 | | 10/2013 | Krilic |
| 2015/0153223 A1 | * | 6/2015 | Onishi ...................... G01J 1/42 250/214 A |
| 2017/0062139 A1 | | 3/2017 | Gon et al. |
| 2019/0082128 A1 | * | 3/2019 | Oh ........................ H04N 5/378 |

OTHER PUBLICATIONS

"Single-Photon Avalanche Diode with Ultrafast Pulse Response Free from Slow Tails"; Andrea Lacaita, et al.; IEEE Electron Device Letters, vol. 14, No. 7 (Jul. 1993).

"Avalanche Detector with Ultraclean Response for Time-Resolved Photon Counting"; Alessandro Spinelli, et al.; IEEE Journal of Quantum Electronics, vol. 34, No. 5 (May 1998).

"Low-noise and large-area CMOS SPADs with Timing Response free from Slow Tails"; Danilo Bronzi, et al.; 2012 Proceedings of the European Solid-State Device Research Conference (ESSDERC) (Sep. 17-21, 2012).

"Evolution and Prospects for Single-photon Avalanche Diodes and Quenching Circuits"; S. Cova, et al.; Journal of Modern Optics, vol. 51, No. 9-10, pp. 1267-1288 (Jun. 15-Jul. 10, 2004).

"Silicon Planar Technology for Single-Photon Optical Detectors"; Emilio Sciacca, et al.; IEEE Transactions on Electron Devices, vol. 50, No. 4 (May 2003).

"A Technical Guide to Silicon Photomultipliers (SiPM)"; Slawomir S. Piatek; Hamamatsu Photonics; URL—https://www.hamamatsu.com/us/en/community/optical_sensors/articles/technical_guide_to_silicon_photomultipliers_sipm/index.html (retrieved on Jan. 19, 2018).

"Self-protecting Semiconductor Optical Limiters"; D. J. Hagan, et al.; Optics Letters, vol. 13, No. 4 (Apr. 1988).

"Silicon Photo Multipliers Detectors Operating in Geiger Regime: an Unlimited Device for Future Applications"; Giancarlo Barbarino, et al.; InTech Photodiodes—World Activities in 2011 (Jul. 2011).

"The SiPM Physics and Technology—a Review"; G. Collazuol; International Workshop on New Photon-Detectors 2012 (PhotoDet 2012) (Jun. 13-15, 2012).

\* cited by examiner

Side View

Top View

Side View

Side View

Side View

Side View

Side View

CONTROLLING DETECTION TIME IN PHOTODETECTORS

CROSS-REFERENCE TO RELATED APPLICATIONS

The present application claims priority to Non-Provisional patent application Ser. No. 15/939,619, filed with the U.S. Patent and Trademark Office on Mar. 29, 2018, which claims benefit of Provisional Patent Application No. 62/623,388, filed with the U.S. Patent and Trademark Office on Jan. 29, 2018 and, the contents of each of which are hereby incorporated by reference.

BACKGROUND

Unless otherwise indicated herein, the materials described in this section are not prior art to the claims in this application and are not admitted to be prior art by inclusion in this section.

Light detection and ranging (LIDAR) devices may estimate distances to objects in a given environment. For example, an emitter subsystem of a LIDAR system may emit near-infrared light pulses, which may interact with objects in the system's environment. At least a portion of the light pulses may be redirected back toward the LIDAR (e.g., due to reflection or scattering) and detected by a receiver subsystem. Conventional receiver subsystems may include a plurality of detectors and a corresponding controller configured to determine an arrival time of the respective light pulses with high temporal resolution (e.g., ~400 ps). The distance between the LIDAR system and a given object may be determined based on a time of flight of the corresponding light pulses that interact with the given object.

The detectors of such a LIDAR system may include one or more photodetectors. Such photodetectors may be especially sensitive detectors (e.g., avalanche photodiodes (APDs)). In some examples, such photodetectors may even be capable of detecting single photons (e.g., single-photon avalanche diodes (SPADs)). In some cases, such photodetectors can be arranged (e.g., through an electrical connection in series) into an array (e.g., as in a silicon photomultiplier (SiPM)).

SUMMARY

When using a sensitive photodetector to detect light, such as an APD or a SPAD, dark current can inhibit detection accuracy. As described herein, a photodetector may be fabricated on a substrate. If minority carriers are generated in the substrate (e.g., due to photoexcitation) that have a sufficiently long lifetime and sufficiently high diffusion coefficient, those minority carriers may diffuse to the detection region of the photodetector after the light source has stopped irradiating the photodetector. This can result in an output signal from the photodetector even when the light source is no longer present (i.e., can result in dark current). The present disclosure describes a plurality of techniques that may ameliorate this possible issue. As examples, surface defects may be introduced that allow for recombination of electrons and holes, crystallographic defects may be introduced that allow for recombination of electrons and holes, a depth of the substrate may be limited to a specified number of minority carrier diffusion lengths to reduce the distance minority carriers can travel before entering the junction and to reduce the volume over which minority carriers can be photoexcited (e.g., to reduce the number of minority carriers overall), a band structure of the substrate may be designed in a specific way (e.g., by introducing a potential barrier or a potential well), introducing an anti-reflective layer to permit photons from the light source to exit the substrate, polishing or planarizing a backside of the substrate to prevent reflections within the substrate of the light from the light source (e.g., to reduce the number of minority carriers generated due to photoexcitation by permitting photons to exit the substrate), and/or introducing a band-reject optical filter that filters light of a wavelength corresponding to the light source (e.g., to reduce the number of minority carriers generated due to photoexcitation).

In one aspect, a device is provided. The device includes a substrate. The device also includes a photodetector coupled to the substrate. The photodetector is arranged to detect light emitted from a light source that irradiates a top surface of the device. The substrate includes surface defects on a second surface of the substrate. The surface defects allow for recombination of electrons and holes so as to mitigate dark current arising from minority carriers photoexcited in the substrate based on the light emitted from the light source.

In another aspect, a device is provided. The device includes a substrate. The device also includes a photodetector coupled to the substrate. The photodetector is arranged to detect light emitted from a light source that irradiates a top surface of the device. The substrate includes crystallographic defects that allow for recombination of electrons and holes so as to mitigate dark current arising from minority carriers photoexcited in the substrate based on the light emitted from the light source.

In yet another aspect, a device is proved. The device includes a substrate. The device also includes a photodetector coupled to the substrate. The photodetector is arranged to detect light emitted from a light source that irradiates a top surface of the device. A depth of the substrate is at most 100 times a diffusion length of a minority carrier within the substrate so as to mitigate dark current arising from minority carriers photoexcited in the substrate based on the light emitted from the light source.

In still another aspect, a device is provided. The device includes a substrate. The device also includes a photodetector coupled to the substrate. The photodetector is arranged to detect light emitted from a light source that irradiates a top surface of the device. The device has a band structure based on a material composition of the substrate and the photodetector. The band structure is configured to mitigate dark current arising from minority carriers photoexcited in the substrate based on the light emitted from the light source.

In a further aspect, a device is provided. The device includes a substrate. The device also includes a photodetector coupled to the substrate. The photodetector is arranged to detect light emitted from a light source that irradiates a top surface of the device. Further, the device includes an anti-reflective layer coupled to a second surface of the substrate. The anti-reflective layer is configured to couple light passing through the substrate to an exterior of the device, thereby preventing reflections within the substrate of the light emitted from the light source so as to reduce minority carrier photoexcitation in the substrate based on the light emitted from the light source, so as to mitigate dark current arising from minority carriers photoexcited in the substrate based on the light emitted from the light source.

In even yet another aspect, a device is provided. The device includes a substrate. The device also includes a photodetector coupled to the substrate. The photodetector is arranged to detect light emitted from a light source that irradiates a top surface of the device. A second surface of the substrate is polished or planarized, thereby preventing reflections within the substrate of the light emitted from the light source so as to reduce minority carrier photoexcitation in the substrate based on the light emitted from the light source, thereby mitigating dark current arising from minority carriers photoexcited in the substrate based on the light emitted from the light source.

In yet a further aspect, a device is provided. The device includes a substrate. The device also includes a photodetector coupled to the substrate. Further, the device includes a band-reject optical filter. The photodetector is arranged to detect light emitted from a light source that irradiates a top surface of the device. Light from the light source that irradiates the top surface of the device is transmitted through the band-reject optical filter. The band-reject optical filter is configured to reduce intensity of one or more wavelengths of the light emitted from the light source, so as to reduce minority carrier photoexcitation in the substrate based on the light emitted from the light source, thereby mitigating dark current arising from minority carriers photoexcited in the substrate based on the light emitted from the light source.

In one more aspect, a device is provided. The device includes a substrate. The device also includes a photodetector coupled to the substrate. Further, the device includes a non-linear optical absorber. The photodetector is arranged to detect light emitted from a light source that irradiates a top surface of the device. Light from the light source that irradiates the top surface of the device is transmitted through the non-linear optical absorber In still yet another further aspect, a method is provided. The method includes providing a device. The device includes a substrate. The device also includes a photodetector coupled to the substrate. The photodetector is arranged to detect light emitted from a light source that irradiates a top surface of the device. The method also includes providing light from the light source. Further, the method includes mitigating dark current arising from minority carriers photoexcited in the substrate based on the light emitted from the light source. The non-linear optical absorber is configured to reduce intensity of one or more wavelengths of the light emitted from the light source that are at or above a threshold power level, so as to reduce minority carrier photoexcitation in the substrate based on the light emitted from the light source, thereby mitigating dark current arising from minority carriers photoexcited in the substrate based on the light emitted from the light source In even yet another further aspect, a method of manufacture is provided. The method includes providing a substrate. The method also includes forming a photodetector within or on the substrate. The photodetector is arranged to detect light emitted from a light source that irradiates a top surface of the photodetector. The method also includes performing a processing step that mitigates dark current arising from minority carriers photoexcited in the substrate based on the light emitted from the light source.

In an additional aspect, a system is provided. The system includes a means for providing a device. The device includes a substrate. The device also includes a photodetector coupled to the substrate. The photodetector is arranged to detect light emitted from a light source that irradiates a top surface of the device. The system also includes a means for providing light from the light source. Further, the system includes a means for mitigating dark current arising from minority carriers photoexcited in the substrate based on the light emitted from the light source.

In yet another additional aspect, a system for manufacture is provided. The system includes a means for providing a substrate. The system also includes a means for forming a photodetector within or on the substrate. The photodetector is arranged to detect light emitted from a light source that irradiates a top surface of the photodetector. Further, the system includes a means for performing a processing step that mitigates dark current arising from minority carriers photoexcited in the substrate based on the light emitted from the light source.

These as well as other aspects, advantages, and alternatives will become apparent to those of ordinary skill in the art by reading the following detailed description, with reference, where appropriate, to the accompanying drawings.

DETAILED DESCRIPTION

Figure 1A:
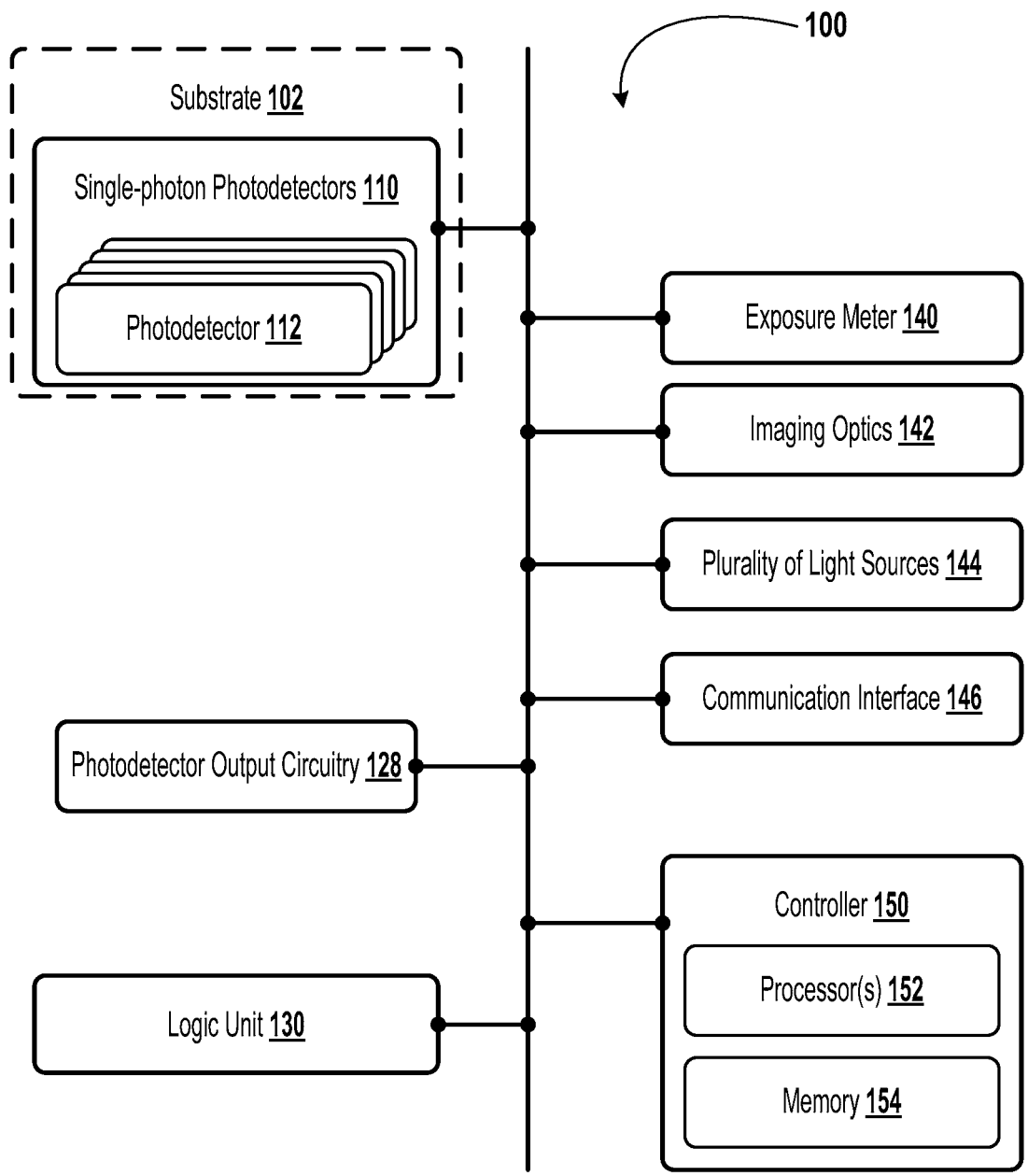
FIG. 1A is a schematic illustration of a system, according to example embodiments.

Example methods and systems are described herein. Any example embodiment or feature described herein is not necessarily to be construed as preferred or advantageous over other embodiments or features. The example embodiments described herein are not meant to be limiting. It will be readily understood that certain aspects of the disclosed systems and methods can be arranged and combined in a wide variety of different configurations, all of which are contemplated herein.

Furthermore, the particular arrangements shown in the figures should not be viewed as limiting. It should be understood that other embodiments might include more or less of each element shown in a given figure. Further, some of the illustrated elements may be combined or omitted. Yet further, an example embodiment may include elements that are not illustrated in the figures.

I. Overview

While operated in a Geiger mode, SiPMs, SPADs, and other types of sensitive photodetectors can provide single-photon-level sensing. A Geiger mode, for example, may include a strong reverse bias condition of a p-n junction in order to generate multiple carriers within a depletion region for a single photoexcitation event (e.g., through avalanche breakdown). However, because of the strong bias conditions, dark current can arise from thermally generated minority carriers that cascade into measurable numbers of minority carriers. In addition to thermally generated minority carriers, some minority carriers may be photoexcited in a substrate of a device by photons that pass unabsorbed through the junction and are absorbed in the substrate. "Dark current" may occur when a photodetector is outputting a signal, even after a light source is no longer irradiating the photodetector. This may alternatively and interchangeably be referred to herein as "spurious current," "spurious output signals," "dark counts," or "an extended time decay constant associated with a detection event."

If minority carriers photoexcited in the substrate have a sufficiently long diffusion length, those carriers can make it to the depletion region of the device before recombining, which causes a cascade event and eventually results in a detectable signal. Such a detectable signal may exist significantly after the light source has ceased irradiating the device (e.g., tens of nanoseconds, hundreds of nanoseconds, microseconds, or tens of microseconds after the illumination event). As an example, SiPMs may experience dark current with a long time decay (i.e., high associated time constant) in scenarios with relatively high light levels (e.g., due to retroreflection of light from a light source, a feedback pulse from light scattered from a light source positioned near the sensitive photodetector, or an external light source that interferes with the photodetector). Because dark current generated by minority carriers photoexcited in the substrate can lead to spurious output signals and/or an increased time constant corresponding to when the photodetector has returned to its resting state and can again properly measure illumination events (i.e., the illumination event has a response signal with a "long tail"), a method of ameliorating, mitigating, or removing the dark current generated by minority carriers photoexcited in the substrate could improve photodetector performance. Said a different way, methods of reducing a time constant associated with a detection event based on the illumination by the light source may improve photodetector performance.

Multiple methods, devices, systems, and designs are described herein to mitigate such a dark current. The strategies employed herein to mitigate the dark current arising from minority carriers photoexcited in the substrate can be lumped into one or more of three main categories, which include: (1) ensuring that carriers are only photoexcited relatively close to the depletion region of the photodetector junction and/or increasing the rate at which minority carriers progress toward the junction, so as to reduce the number of straggling minority carriers that diffuse to the junction (i.e., increase the rate at which minority carriers are evacuated from the substrate); (2) preventing minority carriers that are photoexcited at a certain distance from the depletion region from ever reaching the depletion region; and (3) reducing the number of minority carriers photoexcited in one or more regions of the device.

Some example techniques that fall into category (1) above include: thinning the substrate to reduce the maximum distance from the junction at which photoexcitation can take place; engineering the design of the band structure near the junction to introduce an electric field that increases the drift current of minority carriers moving toward the depletion region of the junction; and designing a band structure that includes one or more heterostructures, where the heterostructures limit the absorption depth at a specified depth (e.g., by having a material with a band gap higher than the excitation energy at all depths greater than the specified absorption depth).

Some example techniques that fall into category (2) above include: introducing surface defects at a surface (e.g., a back surface or bottom surface) of the substrate or edges of the substrate, such that minority carriers can more readily recombine using trap states (e.g., via trap-assisted recombination), thereby reducing minority carrier lifetime and limiting the diffusion length of the minority carriers; introducing crystallographic defects in the bulk of the substrate, such that minority carriers can more readily recombine using trap states (e.g., via trap-assisted recombination), thereby reducing minority carrier lifetime and limiting the diffusion length of the minority carriers; modifying operating temperature in the substrate in order to reduce the diffusion constant of minority carriers (e.g., by reducing the minority carrier mobility), thereby limiting the diffusion length of the minority carriers; and introducing a potential barrier and/or a potential well into the band structure of the substrate to prevent diffusing minority carriers from reaching the junction.

Some example techniques that fall into category (3) above include: thinning the substrate to reduce the total volume over which photoexcitation can take place, thereby allowing fewer minority carriers to be photoexcited in the substrate; modifying characteristics of the light source illuminating the device (e.g., illumination wavelength, illumination pulse frequency, illumination pulse duty cycle, illumination power, etc.) to modulate the amount of photoexcitation occurring in the substrate; coupling an anti-reflective layer (e.g., a Bragg grating, a quarter-wave optical layer, or an index-matched, passive substrate) to a surface (e.g., a back surface or bottom surface) of the substrate such that light more readily couples to an exterior of the substrate, thereby preventing internal reflections of light without the substrate and reducing the number of photoexcited minority carriers; and optically coupling a band-reject optical filter to the top of the photodetector in order to reduce intensity of one or more wavelengths of light entering the photodetector, thereby reducing the amount of minority carriers that are photoexcited at that wavelength.

II. Example Systems

FIG. 1A illustrates a system 100, according to example embodiments. The system 100 includes a plurality of single-photon photodetectors 110 that is coupled to a substrate 102. The plurality of single-photon photodetectors 110 includes a plurality of photodetectors 112. While described as "a plurality single-photon photodetectors 110," it is understood that, in other embodiments, photodetectors that might not be normally capable of actual "single-photon" detection could be used. In some embodiments, the plurality of single-photon photodetectors 110 coupled to the substrate 102 may represent a SiPM. Each photodetector 112 may be the same or different in various embodiments. For example, some photodetectors 112 may be APDs while other photodetectors are SPADs. In still other embodiments, one or more of the photodetectors 112 may be a p-type-intrinsic-n-type (PIN) photodiode detector. Other photodetectors are also possible and contemplated herein. Further, in alternative embodiments, the system 100 may only include a single photodetector 112 on the substrate 102, rather than the plurality of single-photon photodetectors 110.

In some embodiments, the substrate 102 may include a first surface. In such embodiments, the first surface could be disposed along a primary plane of the substrate 102.

The plurality of single-photon photodetectors 110 could be coupled to the first surface. For example, the plurality of single-photon photodetectors 110 could be disposed in a side-by-side arrangement on the same surface of the substrate 102 (e.g., in an array).

In another embodiment, at least a portion of detectors of the plurality of single-photon photodetectors 110 could be arranged along the first surface and connected electrically in series so as to form a series photodetector arrangement. Alternatively, the plurality of single-photon photodetectors 110 could be arranged along the first surface and connected electrically in parallel so as to form a parallel photodetector arrangement. In other embodiments, the plurality of single-photon photodetectors 110 could be disposed in other arrangements and/or coupled to different surfaces of the substrate 102 (e.g., multiple photodetectors 112 could be coupled to an upper surface of one another, e.g., in a daisy-chain arrangement, so as to form a stacked photodetector arrangement).

Yet further, while examples described herein relate to the substrate 102, it will be understood that other embodiments could include the respective detectors arranged on two or more substrates. For instance, half of the plurality of single-photon photodetectors 110 could be arranged along a surface of a first substrate and the remaining half of the plurality of single-photon photodetectors 110 could be arranged along a surface of a second substrate. Other detector arrangements that include more than one substrate are possible and contemplated herein.

In some embodiments, the plurality of single-photon photodetectors 110 are arranged to detect light from a field of view. In an example embodiment, the system 100 includes imaging optics 142 (e.g., mirrors, filters, and/or lenses). In such embodiments, the plurality of single-photon photodetectors 110 may detect light from the shared field of view by way of the imaging optics 142.

In some embodiments, the system 100 includes photodetector output circuitry 128. The plurality of single-photon photodetectors 110 may be coupled to the photodetector output circuitry 128.

The system 100 may also include a logic unit 130. The logic unit 130 may, in some embodiments, make determinations about operating conditions of the plurality of single-photon photodetectors 110 (e.g., whether to operate the plurality of single-photon photodetectors 110 in a series or a parallel arrangement or how to bias one or more of the photodetectors 112).

In some embodiments, the system 100 includes an exposure meter 140. The exposure meter 140 may be configured to provide information indicative of a lighting condition to the logic unit 130.

In some example embodiments, the system 100 may include a plurality of light sources 144. The plurality of light sources 144 may include lasers or optical fiber amplifiers, although other types of light sources are also contemplated. Other amounts and/or arrangements of light sources are possible and contemplated.

The system 100 additionally includes a controller 150. In some embodiments, the controller 150 may include some or all of the functionality of logic unit 130. The controller 150 includes at least one processor 152 and a memory 154. The at least one processor 152 may include, for instance, an application-specific integrated circuit (ASIC) or a field-programmable gate array (FPGA). Other types of processors, computers, or devices configured to carry out software instructions are contemplated herein. The memory 154 may include a non-transitory computer-readable medium, such as, but not limited to, read-only memory (ROM), programmable read-only memory (PROM), erasable programmable read-only memory (EPROM), electrically erasable programmable read-only memory (EEPROM), non-volatile random-access memory (e.g., flash memory), a solid state drive (SSD), a hard disk drive (HDD), a Compact Disc (CD), a Digital Video Disk (DVD), a digital tape, read/write (R/W) CDs, R/W DVDs, etc.

The at least one processor 152 is configured to execute program instructions stored in the memory 154 so as to carry out operations. In some embodiments, the operations include receiving a photodetector signal from the plurality of single-photon photodetectors 110. In some embodiments, the photodetector signal may be indicative of light from the field of view detected by the single-photon photodetectors 110. In some embodiments, the operations may also include determining an intensity of light in the field of view based on the photodetector signal.

In some embodiments, the operations may further include receiving information indicative of an exposure condition of at least a portion of the field of view. For example, the exposure meter 140 may provide information about the exposure condition.

The controller 150 may include a computer disposed on a vehicle, an external computer, or a mobile computing platform, such as a smartphone, tablet device, personal computer, wearable device, etc. Additionally or alternatively, the controller 150 may include, or be connected to, a remotely-located computer system, such as a cloud server. In an example embodiment, the controller 150 may be configured to carry out some or all method blocks or steps described herein.

Further, in some embodiments, the controller 150 may execute instructions to modify operation of one or more of the photodetectors 112 in order to mitigate dark current occurring within the respective photodetectors 112. For example, the operations may include moving a band-reject optical filter over one or more photodetectors 112 using a piezoelectric or electric stage. Additionally or alternatively, the operations may include modifying the rejected wavelength(s) or the intensity reduction of such a band-reject optical filter.

In example embodiments involving the plurality of light sources 144, the operations may include causing the plurality of light sources 144 to emit light (e.g., within the infrared (IR) or near infrared (NIR)) into an external environment of the system so as to interact with objects in the external environment to provide reflected light. The light detected from the shared field of view may include at least a portion of the reflected light. In such scenarios, the system 100 includes at least a portion of a light detection and ranging (LIDAR) system. The LIDAR system may be configured to provide information (e.g., point cloud data) about one or more objects (e.g., location, shape, etc.) in the external environment. While some described embodiments include several light sources, other embodiments contemplated herein may include a single light source.

In an example embodiment, the LIDAR system could provide point cloud information, object information, mapping information, or other information to a vehicle. The vehicle could be a semi- or fully-automated vehicle. For example, the vehicle could be a self-driving car or an autonomous drone, an autonomous truck, an autonomous boat, an autonomous submarine, an autonomous helicopter, or an autonomous robot. Other types of vehicles are contemplated herein.

System 100 may include a communication interface 146. The communication interface 146 may be configured to provide a communication link between various elements of system 100 such as the controller 150, the plurality of single-photon photodetectors 110, the logic unit 130, one or more computing networks, and/or other vehicles.

The communication interface 146 could be, for example, a system configured to provide wired or wireless communication between one or more other vehicles, sensors, or other elements described herein, either directly or via a communication network. To this end, the communication interface 146 may include an antenna and a chipset for communicating with the other vehicles, sensors, servers, or other entities either directly or via the communication network. The chipset or communication interface 146 in general may be arranged to communicate according to one or more types of wireless communication (e.g., protocols) such as BLUETOOTH, BLUETOOTH LOW ENERGY (BLE), communication protocols described in IEEE 802.11 (including any IEEE 802.11 revisions) (e.g., WIFI), cellular technology (e.g., GSM, CDMA, UMTS, EV-DO, WiMAX, or LTE), communication protocols described in IEEE 802.15.4 (e.g., ZIGBEE), dedicated short range communications (DSRC), and radio frequency identification (RFID) communications, among other possibilities. The communication interface 146 may take other forms as well.

Figure 1B:
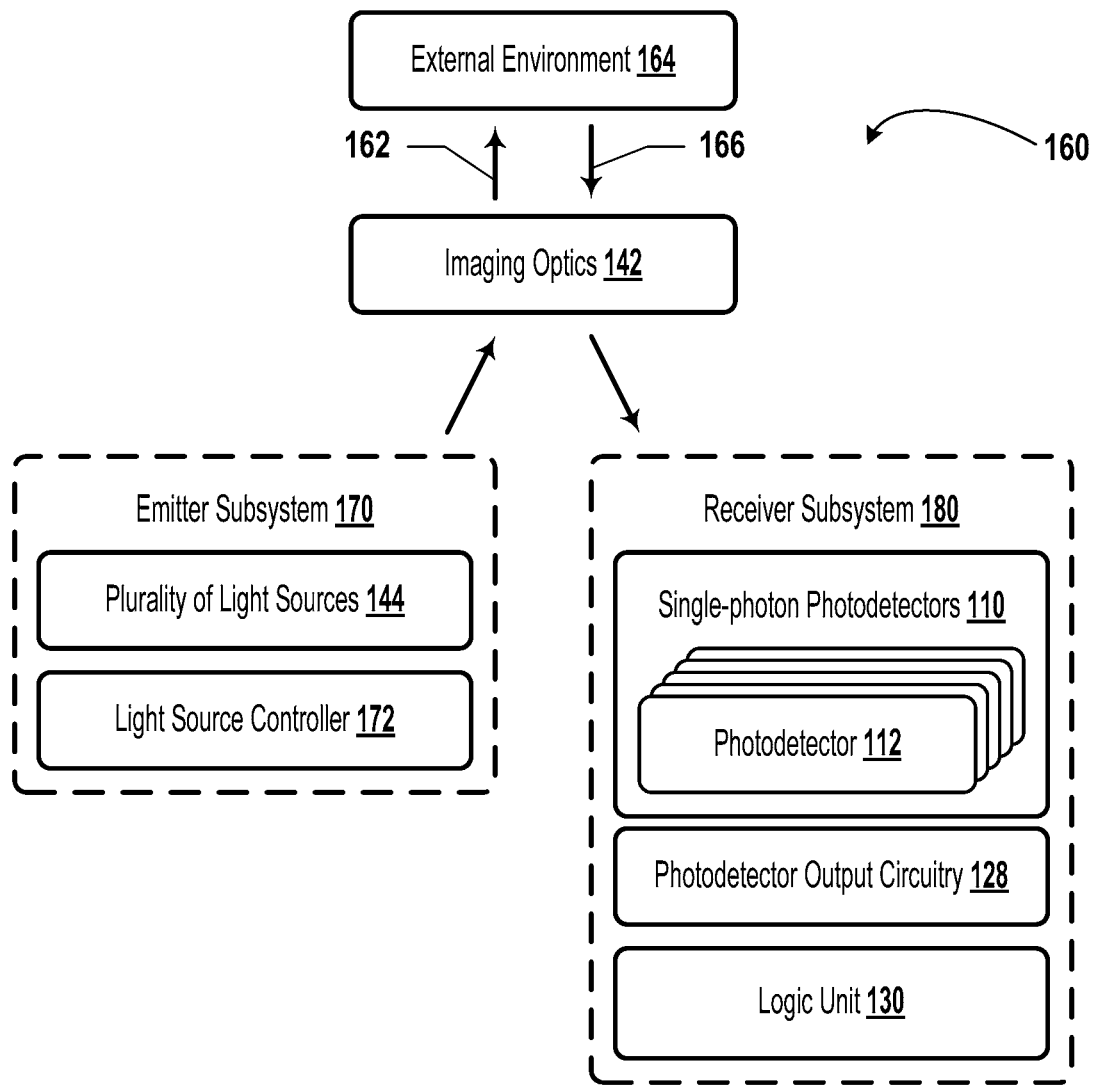
FIG. 1B is a schematic illustration of a system, according to example embodiments.

FIG. 1B illustrates a system 160, according to an example embodiment. System 160 may include some, or all, of the elements of system 100, as illustrated and described with reference to FIG. 1A. For example, system 160 may include an emitter subsystem 170, which may include the plurality of light sources 144 and a light source controller 172. The plurality of light sources 144 may be controlled by the light source controller 172.

System 160 also includes a receiver subsystem 180. The receiver subsystem 180 may include the plurality of single-photon photodetectors 110. Further, the photodetectors 112 of the plurality of single-photon photodetectors 110 could be coupled to the photodetector output circuitry 128.

The receiver subsystem 180 also includes the logic unit 130.

The emitter subsystem 170 and the receiver subsystem 180 may be coupled to the imaging optics 142. In such a scenario, the plurality of light sources 144 may be configured to emit light pulses 162 into an external environment 164 of the system 160. The light pulses 162 may interact with objects in the external environment 164. For example, the light pulses 162 may be reflected by the objects, at least in part, back towards the receiver subsystem 180 as reflected light 166. The reflected light 166 may be received by the receiver subsystem 180 via the imaging optics 142.

Figure 2A:
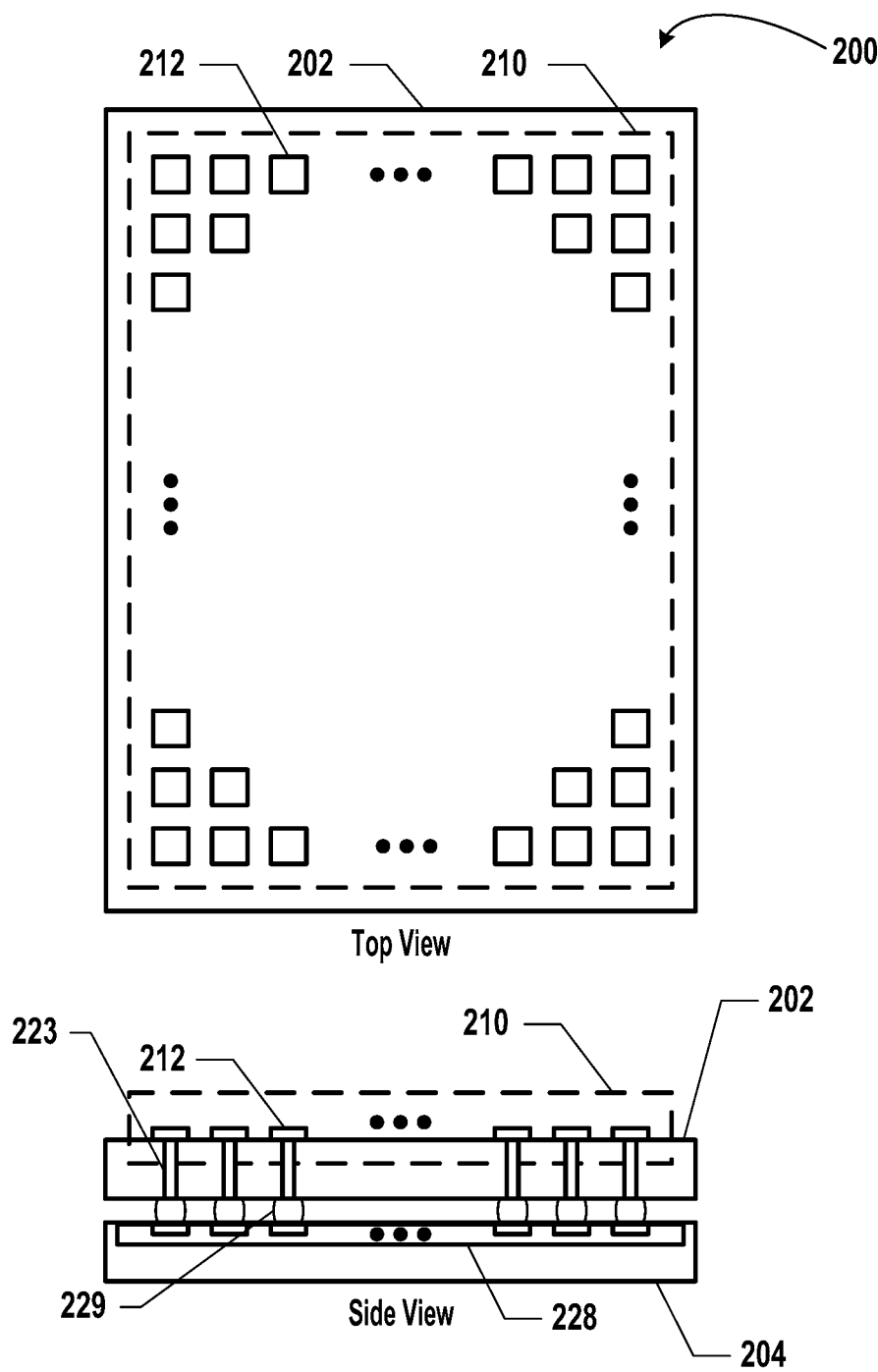
FIG. 2A is a schematic illustration of a system, according to example embodiments.

FIG. 2A illustrates a system 200, according to example embodiments. System 200 may include elements that are similar or identical to systems 100 and 160 as illustrated and described with reference to FIGS. 1A and 1B. The system 200 includes a substrate 202. The substrate 202 may be coupled to a plurality of single-photon photodetectors 210. In such embodiments, the plurality of single-photon photodetectors 210 may include multiple photodetectors 212. For example, the photodetectors 212 could be disposed in a rectangular array along a first surface (e.g., a top surface) of the substrate 202. Other arrangements of the photodetectors 212 are also possible.

In an example embodiment, the respective photodetectors 212 of the plurality of single-photon photodetectors 210 could be coupled to photodetector output circuitry 228 (e.g., a readout integrated circuit (ROTC)) on a second substrate 204 by way of respective arrays of through-wafer vias 223 and bump bonds 229. Other types of electrically-conductive or wireless connections are contemplated herein.

Figure 2B:
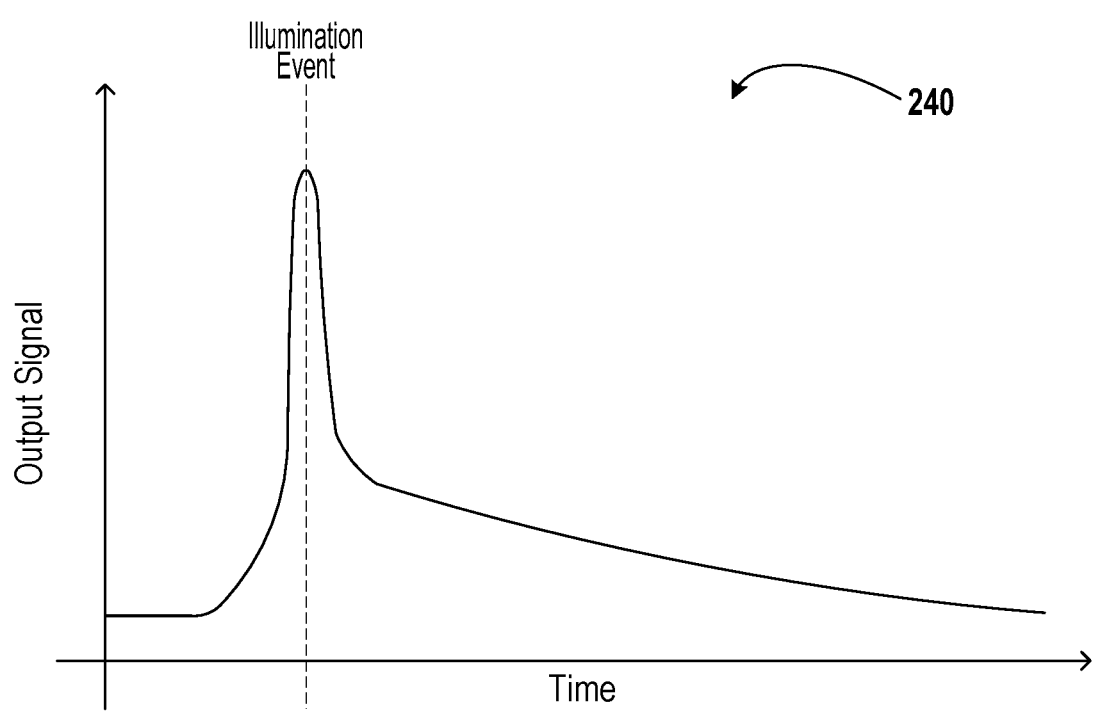
FIG. 2B is a plot of an illumination event of a device or a system, according to example embodiments.

FIG. 2B is a plot 240 of an illumination event of a device or a system. For example, the plot 240 may represent an illumination event of the system 200 illustrated in FIG. 2A, the plurality of single-photon photodetectors 210 illustrated in FIG. 2A, or one of the photodetectors 212 illustrated in FIG. 2A.

As illustrated by the tail in FIG. 2B, after the illumination event occurs, the time decay of the output signal of the device or system may last for a relatively long time compared to the length of the illumination event (i.e., the decay process may have a relatively high associated time constant). As described above, this may be attributed to dark current arising from thermally generated carriers and/or carriers photoexcited in a bulk region (e.g., an undepleted bulk region) of the substrate that take a relatively long time to reach the junction of the photodetector.

Because the output signal does not necessarily rapidly decay to its resting state, the output signal at times much after the actual illumination event might be mistaken for additional illumination events (e.g., based on a threshold set in a computing device). Further, due to previous high intensity illumination and extended dark current, an output signal of the photodetector (e.g., the SiPM) may have a compressed amplitude. Such a compressed amplitude might lead to ambiguity regarding the raw intensity of the present illumination event within the output signal. In an effort to avoid mistaken determinations of illumination events and/or illumination intensities based on the output signal, the system or device might have a time delay (i.e., a lag) introduced between illumination events to ensure that the system or device returns to its resting state before another illumination measurement is taken. Even if such a technique may help disambiguate illumination events, it has the potential drawback of limiting the rate at which measurements can be taken by the device or system. Thus, a method of quenching or permanently reducing the time constant associated with the decay can allow for an increased sensing rate. Such an increased sensing rate could be useful in a variety of applications that employ photodetectors (e.g., autonomous vehicle navigation using LIDAR, object detection and avoidance using LIDAR, other LIDAR applications, and/or optical communications).

III. Example Devices

Figure 3A:
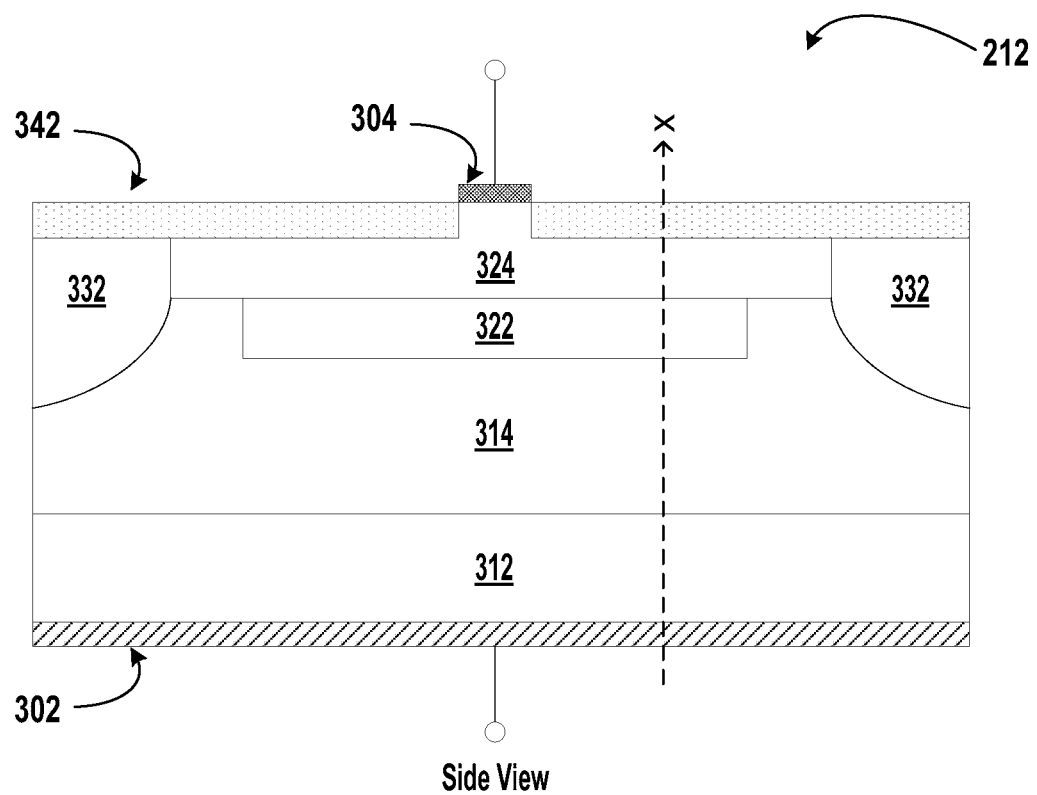
FIG. 3A is an illustration of a device, according to example embodiments.
Figure 3A:
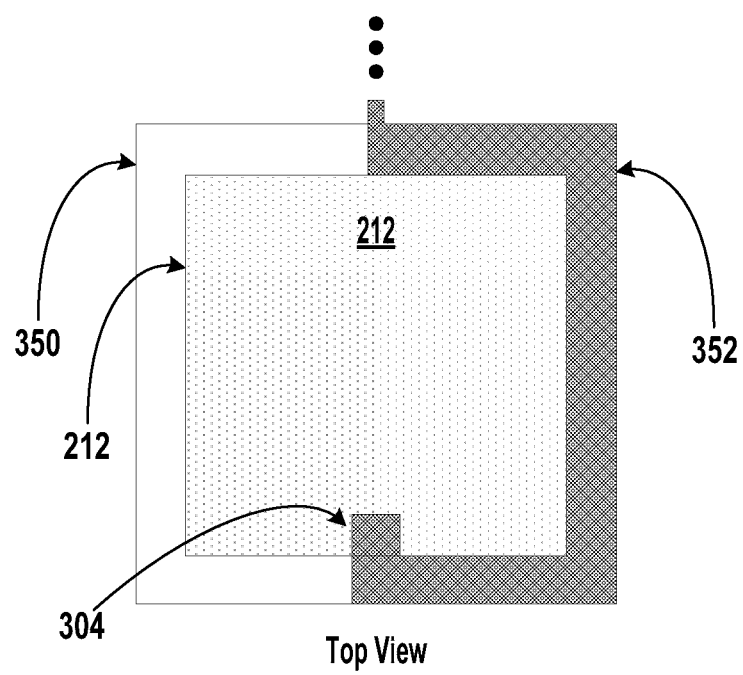

FIG. 3A is an illustration of a device, according to example embodiments. The device may corresponding to one or more of the photodetectors 212 illustrated in FIG. 2A, for example. The device illustrated in FIG. 3A may be configured to detect light (e.g., a single photon), independent of whether the device is a component of a larger system (e.g., a SiPM, such as the system 200 illustrated in FIG. 2A). Notwithstanding, as shown and described with reference to FIG. 2A, the system 200 may collectively also be configured to detect light (e.g., a single photon). It is understood that the device illustrated in FIG. 3A, and all other devices and systems described herein, can be fabricated and/or modified by any fabrication techniques now known or later discovered (e.g., the device in FIG. 3A can be fabricated using semiconductor processing steps such as photolithography, ion implantation, oxidation, etching, chemical deposition, etc.). Further, the device illustrated in FIG. 3A may be an example photodetector prior to or without any dark current mitigation techniques or modifications being used.

The photodetector 212 may include an anode 302, a cathode 304, a first substrate portion 312, a second substrate portion 314, a p-n junction (formed between a heavily doped p-side 322 and a heavily doped n-side 324), guardring regions 332, and a protective layer 342. As illustrated, a depth direction (x) within the photodetector 212 is represented by a dashed line, with higher values of x corresponding to portions of the photodetector 212 nearer to a "top surface" of the photodetector 212.

The anode 302 may be used, in conjunction with the cathode 304, to bias the photodetector 212. For example, in embodiments where, as in FIG. 3A, the junction of the device is a p-n junction (rather than an n-p junction), a negative voltage may be applied at the anode 302. In alternate embodiments (e.g., embodiments where the junction of the device is an n-p junction) reference numeral 302 may instead be a cathode and may instead have a positive voltage applied thereto. The voltage difference between the anode 302 and the cathode 304 may drop across the junction to establish a negative operating bias across the junction. For example, the negative bias may be such that the junction is operating in an avalanche breakdown regime (e.g., in a Geiger mode or a linear-mode). In some embodiments, the negative bias may be between −10 Volts and −20 Volts, between −20 Volts and −50 Volts, between −50 Volts and −100 Volts, between −100 Volts and −150 Volts, between −150 Volts and −200 Volts, between −200 Volts and −250 Volts, or between −250 Volts and −300 Volts, for instance.

The anode 302 may be shared by multiple devices (e.g., multiple photodetectors within an array may share a common anode). In other embodiments, individual anodes 302 (i.e., one anode 302 per device) may be used. As illustrated, the anode 302 may include a bonding pad to which one or more electrical leads or interconnects could be electrically coupled (e.g., soldered). Such a bonding pad may be defined on a bottom side of the photodetector 212, as illustrated in FIG. 3A. In alternate embodiments, the anode 302 may include a bonding pad defined on a top surface of the photodetector 212. Such a top-surface bonding pad may connect to a bottom side of the photodetector 212 (e.g., bottom side of the substrate) through a via defined within the layers of the photodetector 212. Such a via may be a metallic (e.g., a gold, silver, copper, platinum, palladium, tungsten, aluminum, titanium, nickel, molybdenum, or tantalum) via or a heavily doped (e.g., degenerately doped) semiconductor via.

The cathode 304, as described above, may be used, in conjunction with the anode 302, to bias the photodetector 212. For example, in embodiments where, as in FIG. 3A, the junction of the device is a p-n junction (rather than an n-p junction), a positive voltage may be applied at the cathode 304. In alternate embodiments (e.g., embodiments where the junction of the device is an n-p junction) reference numeral 304 may instead be an anode and may instead have a negative voltage applied thereto.

The cathode 304 may be shared by multiple devices (e.g., multiple photodetectors within an array may share a common cathode). In other embodiments, individual cathodes 304 (i.e., one cathode 304 per device) may be used. As illustrated, the cathode 304 may include a bonding pad to which one or more electrical leads or interconnects could be electrically coupled (e.g., soldered). Such a bonding pad may be defined on a top side of the photodetector 212, as illustrated in FIG. 3A. In alternate embodiments (e.g., embodiments where the photodetector 212 is flip-chip bonded to an ROIC), the cathode 304 may include a bonding pad defined on a bottom surface of the photodetector 212. Such a bottom-surface bonding pad may connect to a top side of the photodetector 212 (e.g., n-doped side of the p-n junction) through a via defined within the layers of the photodetector 212. Such a via may be a metallic (e.g., a gold, silver, copper, platinum, palladium, tungsten, aluminum, titanium, nickel, molybdenum, or tantalum) via or a heavily doped (e.g., degenerately doped) semiconductor via.

In some embodiments, there may be a quenching resistor electrically coupled (e.g., in a series arrangement) to the anode 302 or the cathode 304 (e.g., depending on orientation of the p-n junction). The quenching resistor may accelerate the rate at which the photodetector returns to Geiger mode after an illumination event occurs.

Collectively, the first substrate portion 312 and the second substrate portion 314 may be referred to as "the substrate." In some embodiments, there may not be a first substrate portion 312 or a second substrate portion 314. For example, in some embodiments, the substrate might be uniformly doped throughout, in which case the entirety of the substrate may be uniform. Further, the first substrate portion 312 and the second substrate portion 314 (as well as possibly the anode 302, the cathode 304, the heavily doped p-side 322, the heavily doped n-side 324, the guardring regions 332, and/or the protective layer 342) may be fabricated by selectively doping a semiconductor wafer (e.g., a silicon wafer). The separate regions of the photodetector 212 may be selectively defined/doped using a combination of photolithography and ion implantation, for example.

The first substrate portion 312 may be doped with a p-type dopant. For example, the first substrate portion 312 may be doped with boron, aluminum, nitrogen, gallium, and/or indium. In alternate embodiments (e.g., embodiments having an n-doped substrate), the first substrate portion 312 may be doped with phosphorus, arsenic, antimony, bismuth, and/or lithium. In various embodiments, the first substrate portion 312 may be doped with a concentration of between $10^{17}$ cm$^{-3}$ and $10^{18}$ cm$^{-3}$, between $10^{18}$ cm$^{-3}$ and $10^{19}$ cm$^{-3}$, between $10^{19}$ cm$^{-3}$ and $10^{20}$ cm$^{-3}$, or between $10^{20}$ cm$^{-3}$ and $10^{21}$ cm$^{-3}$.

The second substrate portion 314 may be doped with a p-type dopant. For example, the second substrate portion 314 may be doped with boron, aluminum, nitrogen, gallium, and/or indium. In alternate embodiments (e.g., embodiments having an n-doped substrate), the second substrate portion 314 may be doped with phosphorus, arsenic, antimony, bismuth, and/or lithium. In various embodiments, the second substrate portion 314 may be doped with a concentration of between $10^{13}$ cm$^{-3}$ and $10^{14}$ cm$^{-3}$, between $10^{14}$ cm$^{-3}$ and $10^{15}$ cm$^{-3}$, between $10^{15}$ cm$^{-3}$ and $10^{16}$ cm$^{-3}$, or between $10^{16}$ cm$^{-3}$ and $10^{17}$ cm$^{-3}$.

The p-n junction (formed between the heavily doped p-side 322 and the heavily doped n-side 324) may be the location within the photodetector 212 where minority carriers that are photoexcited are swept by an electric field to an electrode of the photodetector 212 (e.g., the cathode 304 in FIG. 3A). For example, the p-n junction may include a depletion region (i.e., space charge region). The depletion region may include an induced electric field which accelerates charged minority carriers to the electrode. Further, when negatively biased (e.g., in the Geiger-mode regime), minority carriers (e.g., photoexcited minority carriers) may generate additional minority carriers through avalanche breakdown.

As illustrated in FIG. 3A, the heavily doped p-side 322 may be doped with a p-type dopant. For example, the heavily doped p-side 322 may be doped with boron, aluminum, nitrogen, gallium, and/or indium. In alternate embodiments, reference numeral 322 may instead correspond to an n-type semiconductor. In such embodiments, dopants such as phosphorus, arsenic, antimony, bismuth, and/or lithium may be used. In various embodiments, the heavily doped p-side 322 may be doped with a concentration of between $10^{17}$ cm$^{-3}$ and $10^{18}$ cm$^{-3}$, between $10^{18}$ cm$^{-3}$ and $10^{19}$ cm$^{-3}$, between $10^{19}$ cm$^{-3}$ and $10^{20}$ cm$^{-3}$, or between $10^{20}$ cm$^{-3}$ and $10^{21}$ cm$^{-3}$.

Likewise, as illustrated in FIG. 3A, the heavily doped n-side 324 may be doped with an n-type dopant. For example, the heavily doped n-side 324 may be doped with phosphorus, arsenic, antimony, bismuth, and/or lithium. In alternate embodiments, reference numeral 324 may instead correspond to a p-type semiconductor. In such embodiments, dopants such as boron, aluminum, nitrogen, gallium, and/or indium may be used. In various embodiments, the heavily doped n-side 324 may be doped with a concentration of between $10^{17}$ cm$^{-3}$ and $10^{18}$ cm$^{-3}$, between $10^{18}$ cm$^{-3}$ and $10^{19}$ cm$^{-3}$, between $10^{19}$ cm$^{-3}$ and $10^{20}$ cm$^{-3}$, or between $10^{20}$ cm$^{-3}$ and $10^{21}$ cm$^{-3}$.

The guardring regions 332. In some embodiments, the guardring regions 332 may be n-type (e.g., doped in the n+regime). In alternate embodiments (e.g., wherein the p-n junction of the device is instead an n-p junction and the bulk semiconductor is n-type), the guardring regions 332 may be p-type (e.g., doped in the p+regime). The guardring regions 332 may isolate the photodetector 212 from neighboring photodetectors. Further, the guardring regions 332 may prevent edge-breakdown from occurring. Still further, the guardring regions 332 may be used to fine-tune a shape of the electric field near the p-n junction. In some embodiments, particularly embodiments only having a single photodetector rather than an array of photodetectors, the guardring regions 332 might not be included. In addition to or instead of the guardring regions 332, some embodiments may include optical isolation trenches defined within the substrate.

The protective layer 342 may be included in the photodetector 212 to protect the photodetector 212 from physical damage. In some embodiments, the protective layer 342 may have specifically designed optical properties. For example, in some embodiments, the protective layer 342 may be sized such that it is approximately a quarter of a wavelength thick with respect to an operating wavelength of a light source and the refractive index of the protective layer 342. As such, the protective layer 342 may be λ/4n, where λ represents the operating wavelength (in a vacuum) of the light source and n represents the refractive index of the protective layer 342. For example, if an infrared light source with an operating wavelength of 1.55 μm is being used, and the refractive index of the protective layer 342 is 1.0, the protective layer 342 may be 387.5 nm thick (1.55 μm/4). Likewise, if an infrared light source with an operating wavelength of 905 nm is being used, and the refractive index of the protective layer 342 is 1.0, the protective layer 342 may be 226.25 nm thick (905 nm/4). Having a protective layer 342 that is approximately a quarter of a wavelength thick may maximize transmission of light into the photodetection region of the photodetector. The protective layer 342 may be designed to exhibit additional or alternative optical properties, as well.

In some embodiments, the protective layer 342 may include a material that is optically transparent for the operating wavelength of the light source. For example, the protective layer 342 may include $SiO_2$. In such embodiments, the protective layer 342 may be grown on the photodetector using oxidation (e.g., within an oxidation furnace). It is understood that in other embodiments, the protective layer 342 may include additional or alternative materials.

Figure 3B:
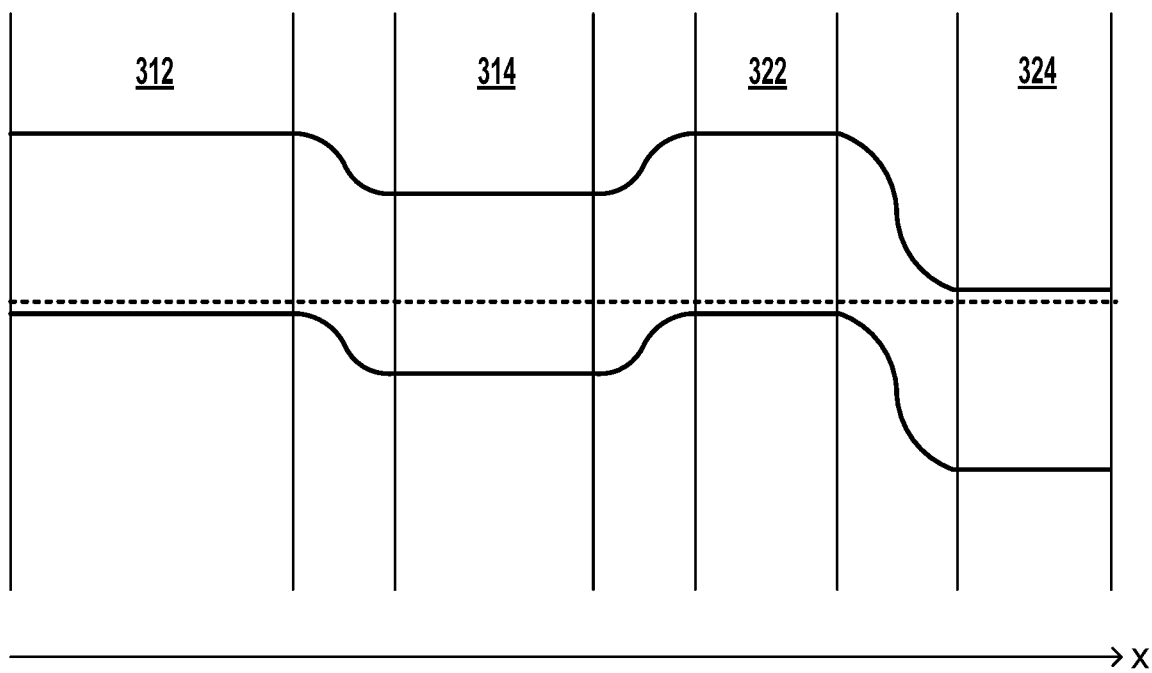
FIG. 3B is a band diagram of the device illustrated in FIG. 3A, according to example embodiments.

As illustrated in the top view portion of FIG. 3B, in some embodiments, a packaging 350 may surround the photodetector 212. The packaging 350 may be of a standardized package size. Such a standardized package size may enable multiple photodetectors 212 to be readily arranged into an array.

Further, as illustrated, the packaging 350 may include a metallic interconnect 352. As illustrated, the metallic interconnect 352 may be electrically coupled to the cathode 304 of the photodetector 212. In addition, the metallic interconnect 352 may be used to make one or more electrical connections (e.g., series or parallel connections) with other photodetectors 212 (e.g., to form an array of photodetectors). The metallic interconnect 352 may include gold, silver, copper, platinum, palladium, tungsten, aluminum, titanium, nickel, molybdenum, tantalum, silicides, salicides, or a heavily doped semiconductor (e.g., a degenerately doped semiconductor), in various embodiments. It is understood that, in other embodiments, alternative materials may be used in addition to or instead of those previously listed for the metallic interconnect 352.

FIG. 3B is a band diagram of the device illustrated in FIG. 3A, according to example embodiments. As indicated by the axis of FIG. 3B, regions nearer to a top surface of the photodetector 212 (i.e., regions with higher x-values) are farther to the right of the band diagram. The reference numerals above the band diagram indicate various regions within the photodetector 212 (e.g., the first substrate portion 312, the second substrate portion 314, the heavily doped p-side 322, and the heavily doped n-side 324). In addition, the dashed line represents a Fermi level within the photodetector 212. Further, the vertical lines overlaying the band diagram may define the various regions within the photodetector 212 as well as junctions between disparate regions within the photodetector 212. The band diagram illustrated in FIG. 3B may represent an equilibrium band diagram (as opposed to a band diagram of the photodetector 212 under forward or reverse bias). Additionally, the junction between the heavily doped p-side 322 and the heavily doped n-side 324 may be a depletion region of the p-n junction formed between the heavily doped p-side 322 and the heavily doped n-side 324. This depletion region may be used to accelerate minority carriers toward an electrode such that generated (e.g., photoexcited) minority carriers correspond to a signal representing an amount photoexcitation. Further, when under reverse bias (e.g., Geiger mode bias conditions or avalanche bias conditions), the depletion region may produce a cascading event for each minority carrier generated, such that multiple additional minority carriers are generated (e.g., via avalanche breakdown). This can lead to increased sensitivity for the photodetector 212 (e.g., single-photon sensitivity).

In some embodiments, the doping between regions may be graded (e.g., linearly graded, logarithmically graded, or exponentially graded). For example, when transitioning from a p+-doped region having a doping concentration of $10^{20}$ cm$^{-3}$ to a p-doped region having a doping concentration of $10^{16}$ cm$^{-3}$, the concentration of the p-type dopant may be varied logarithmically between $10^{20}$ cm$^{-3}$ and $10^{16}$ cm$^{-3}$ with respect to depth. In alternate embodiments, the doping may be abruptly transitioned from $10^{20}$ cm$^{-3}$ to $10^{16}$ cm$^{-3}$.

Each of the various regions within the photodetector 212 may be made of a single material (e.g., Si, Ge, GaAs, or any other semiconductor material). Further, as illustrated, the photodetector 212 band diagram has a p+-type, p-type, p+-type, n+-type structure. In alternate embodiments, the photodetector 212 may instead have a uniform doping throughout the entirety of the substrate (e.g., the first substrate portion 312 and the second substrate portion 314 may have the same dopant concentration). In such embodiments, the band diagram may have a p+-type, n+-type structure or a p-type, p+type, n+-type structure. Still further, rather than the first substrate portion 312 and/or the second substrate portion 314 being p-doped, the first substrate portion 312 and/or the second substrate portion 314 may be undoped (i.e., may be an intrinsic semiconductor). In such embodiments, the band diagram may have a p+-type, i-type, p+-type, n+-type structure; an i-type, p-type, p+-type, n+-type structure; or an i-type, p+-type, n+-type structure. In still other embodiments, rather than a p-n junction, the photodetector 212 may include an n-p junction. In such embodiments, the band diagram may have an n+-type, n-type, n+-type, p+-type structure; an n-type, n+-type, p+-type structure; an n+-type, p+-type structure; an n+-type, i-type, n+-type, p+-type structure; an i-type, n-type, n+-type, p+-type structure; or an i-type, n+-type, p+-type structure.

Figure 4:
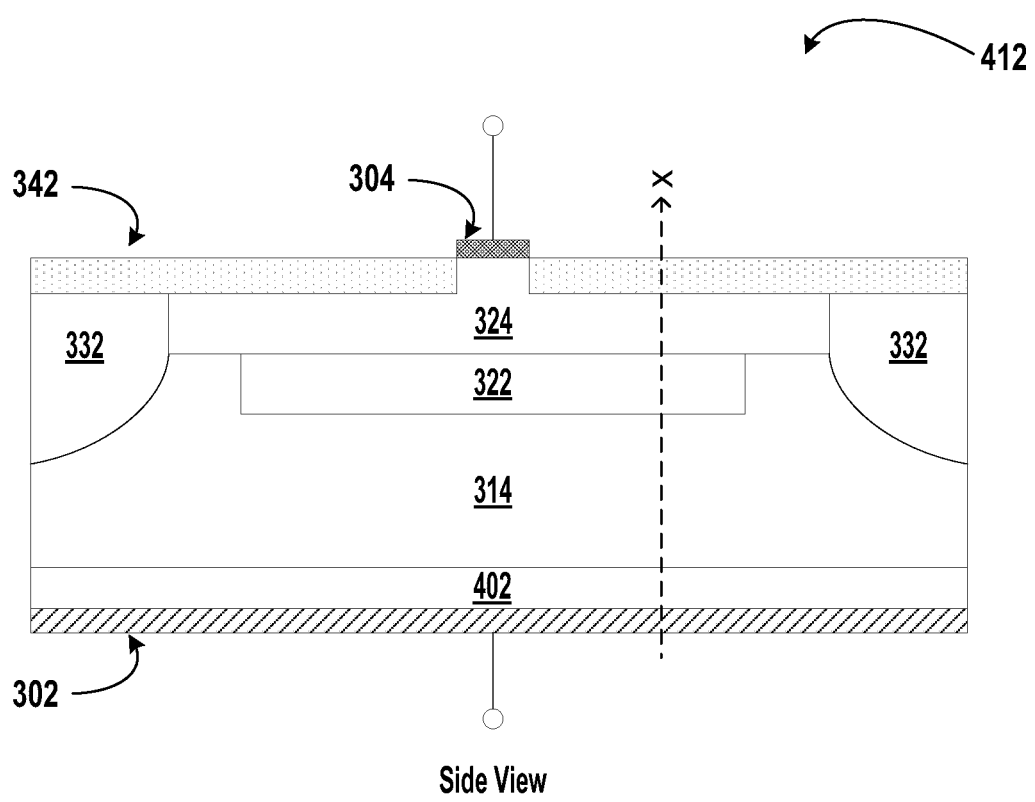
FIG. 4 is an illustration of a device, according to example embodiments.

FIG. 4 is an illustration of a device 412, according to example embodiments. The device 412 may be analogous to the photodetector 212 illustrated in FIG. 3A. As such, the device 412 may include an anode 302, a cathode 304, a second substrate portion 314, a p-n junction (formed between a heavily doped p-side 322 and a heavily doped n-side 324), guardring regions 332, and a protective layer 342. Each of the previously recited components may be substantially the same or identical to the corresponding components shown and described with respect to FIG. 3A.

However, unlike the photodetector 212 illustrated in FIG. 3A, the device 412 includes a thin first substrate portion 402. Because the thin first substrate portion 402 is less deep than the first substrate portion 312 in the photodetector 212 of FIG. 3A, the thin first substrate portion 402 may be less voluminous. As such, there may be a smaller absorption region within the substrate where optical absorption/photoexcitation can occur. Thus, fewer minority carriers may be generated in the substrate of the device 412 when compared with the photodetector 212 illustrated in FIG. 3A, thereby mitigating the amount of dark current arising from minority carriers photoexcited in the substrate of the device 412. Further, because the thin first substrate portion 402 is less deep than the first substrate portion 312, the maximum distance from the p-n junction at which absorption/photo-excitation can occur is reduced. Thus, any minority carriers that are photoexcited within the thin first substrate portion 402 diffuse sufficiently quickly to the p-n junction such that they do not contribute to the time delay between the illumination event and the output signal arising from the minority carriers.

In various embodiments, the thin first substrate portion 402 and/or the substrate (e.g., which includes both the thin first substrate portion 402 and the second substrate portion 314) may be at most 100 times a diffusion length of a minority carrier within the substrate, at most 10 times the diffusion length of the minority carrier within the substrate, at most 0.1 times the diffusion length of the minority carrier within the substrate, or at most 0.01 times the diffusion length of the minority carrier within the substrate. Additionally or alternatively, in various embodiments, the thin first substrate portion 402 and/or the substrate (e.g., which includes both the thin first substrate portion 402 and the second substrate portion 314) may be at most 1000 times an optical absorption length of the substrate, at most 100 times the optical absorption length of the substrate, at most 10 times the optical absorption length of the substrate, at most the optical absorption length of the substrate, at most 0.1 times the optical absorption length of the substrate, at most 0.01 times the optical absorption length of the substrate, or at most $10^{-3}$ times the optical absorption length of the substrate. Other lengths of the first substrate portion 402 and/or the substrate relative to the optical absorption length of the substrate are also contemplated herein.

The thin first substrate portion 402 may be fabricated using a variety of methods. In one embodiment, the thin first substrate portion 402 may be fabricated by removing portions of the substrate in post-processing. For example, if the device 412 is flip-chip bonded on an ROIC (e.g., such that the device 412 is configured to receive illumination from a bottom side of the device, such as a backside of the substrate), a portion of the substrate may be removed (e.g., using chemical etching, such as wet etching or dry etching, or planarization) prior to applying/coupling the anode 302 to the substrate.

In alternate embodiments, the thin first substrate portion 402 may instead be lightly doped or undoped. Still further, in addition to or instead of having a thin first substrate portion 402, the device 412 may also include a thinner second substrate portion (e.g., the second substrate portion 314 may have a smaller depth than illustrated in FIG. 4, so as to further mitigate dark current arising from minority carriers photoexcited in the substrate).

Figure 5:
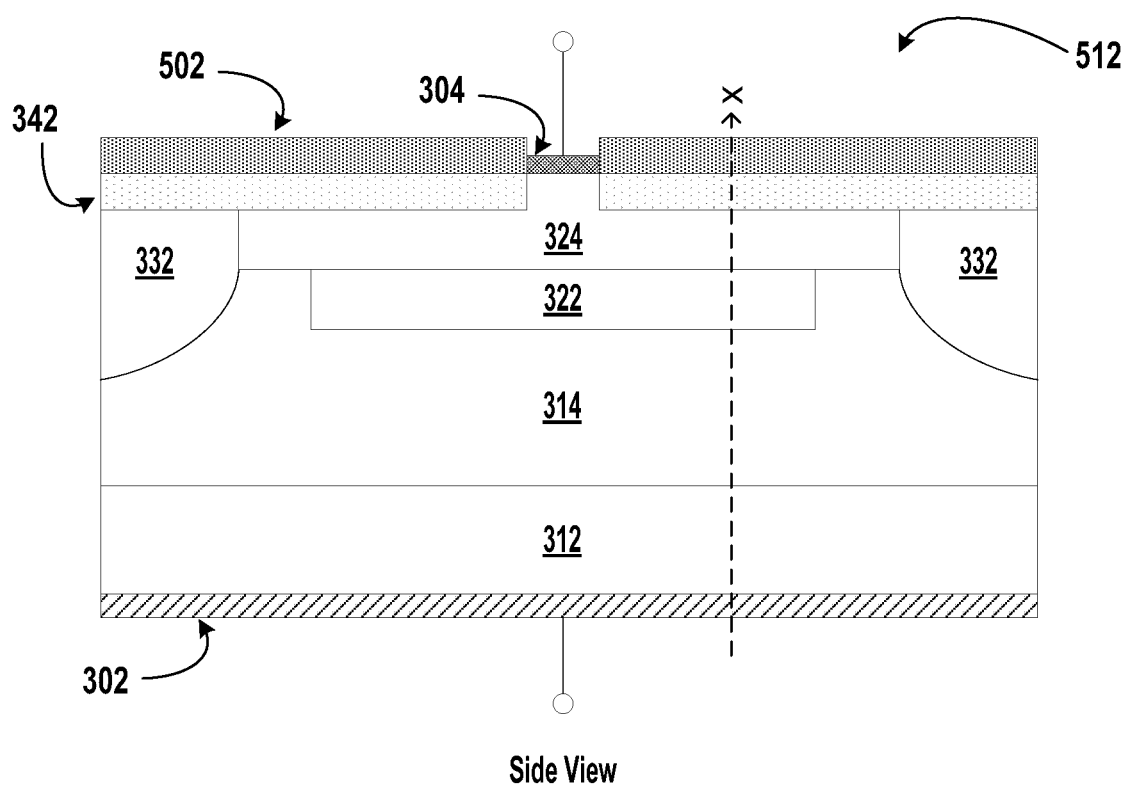
FIG. 5 is an illustration of a device, according to example embodiments.

FIG. 5 is an illustration of a device 512, according to example embodiments. The device 512 may be analogous to the photodetector 212 illustrated in FIG. 3A. As such, the device 512 may include an anode 302, a cathode 304, a first substrate portion 312, a second substrate portion 314, a p-n junction (formed between a heavily doped p-side 322 and a heavily doped n-side 324), guardring regions 332, and a protective layer 342. Each of the previously recited components may be substantially the same or identical to the corresponding components shown and described with respect to FIG. 3A.

However, unlike the photodetector 212 illustrated in FIG. 3A, the device 512 includes a band-reject optical filter 502. As illustrated, the band-reject optical filter 502 may overlay the protective layer 342. Alternatively, in some embodiments, the band-reject optical filter 502 could be located between the protective layer 342 and the heavily doped n-side 324. In some embodiments, the band-reject optical filter 502 may be added to the device 512 in post-processing (e.g., the band-reject optical filter 502 may be retrofitted to a previously fabricated photodetector).

The band-reject optical filter 502 may be configured to reduce an intensity of one wavelength or a range of wavelengths. Such a wavelength or range of wavelengths may correspond to wavelengths output by a light source (e.g., one of the plurality of light sources 144 in the emitter subsystem 170 as illustrated in FIG. 1B). For example, if the light source is a laser that emits light in the infrared portion of the electromagnetic spectrum, the band-reject optical filter 502 may be configured to reduce an intensity of light having wavelengths within the infrared portion of the electromagnetic spectrum. In this way, the intensity of light reaching the photodetector portion of the device 512, and ultimately the substrate, may be reduced. Thus, the amount of photoexcitation of minority carriers within the substrate based on the light emitted from the light source may be reduced, thereby mitigating dark current and reducing a time decay associated with the illumination event.

In addition to or instead of a band-reject optical filter, some embodiments may include other optical components used to reduce intensity of one or more wavelengths of light. For example, a beam splitter (e.g., a half-silvered mirror) or a neutral-density (ND) filter (e.g., ND2 filter, ND4 filter, ND8 filter, ND16 filter, ND32 filter, ND64 filter, ND100 filter, ND128 filter, ND256 filter, ND400 filter, ND512 filter, ND1024 filter, ND2048 filter, ND4096 filter, ND6310 filter, ND8192 filter, ND10000 filter, or ND100000 filter) could be used.

Additionally or alternatively, in some embodiments, a non-linear optical material (e.g., a non-linear optical absorber) may be included. The non-linear optical material may exhibit a non-linear optical response for one or more incoming wavelengths, for example. The non-linear optical material may also include a threshold power level (e.g., defined for at least one of the one or more incoming wavelengths at which the non-linear optical material exhibits the non-linear optical response) at which the non-linear optical material absorbs incoming photons. For example, when incoming light is irradiating the device with an associated power at or above the threshold power level, the non-linear optical material may reduce the intensity of the incoming light. However, when the incoming light is irradiating the device with an associated power below the threshold power level, the non-linear optical material may not reduce the intensity of the incoming light. Such a non-linear optical material may be between 1 nm and 10 nm in thickness, between 10 nm and 100 nm in thickness, between 100 nm and 1 μm in thickness, between 1 μm and 10 μm in thickness, between 10 μm and 100 μm in thickness, between 100 μm and 1 mm in thickness, between 1 mm and 1 cm in thickness, or between 1 cm and 10 cm in thickness, in various embodiments.

Figure 6:
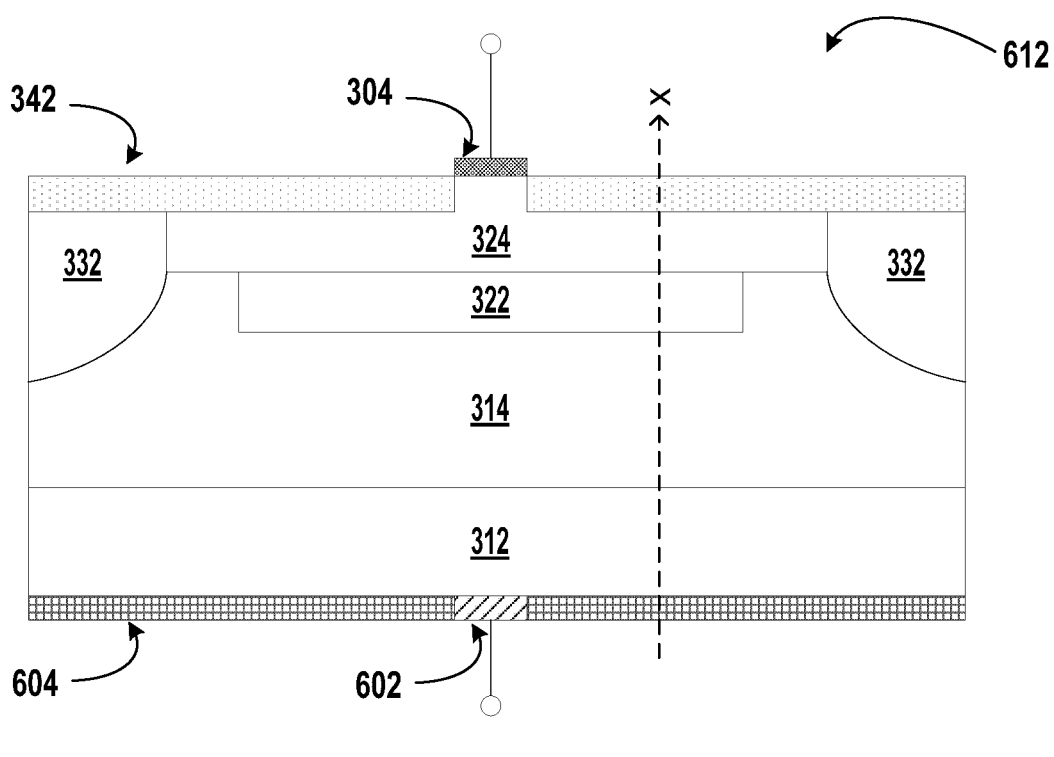
FIG. 6 is an illustration of a device, according to example embodiments.

FIG. 6 is an illustration of a device 612, according to example embodiments. The device 612 may be analogous to the photodetector 212 illustrated in FIG. 3A. As such, the device 612 may include a cathode 304, a first substrate portion 312, a second substrate portion 314, a p-n junction (formed between a heavily doped p-side 322 and a heavily doped n-side 324), guardring regions 332, and a protective layer 342. Each of the previously recited components may be substantially the same or identical to the corresponding components shown and described with respect to FIG. 3A.

However, unlike the photodetector 212 illustrated in FIG. 3A, the device 612 may include a modified anode 602 and an anti-reflective layer 604. The modified anode 602 may have a reduced size, as illustrated. Similar to the cathode 304, the modified anode 602 may be sized such that light can be transmitted around the modified anode 602. Unlike the anode 302 illustrated in FIG. 3A, which may completely cover an entire bottom surface of the first substrate portion 312, the modified anode 602 may only cover a portion of the bottom surface of the first substrate portion 312.

The anti-reflective layer 604 may be disposed adjacent to the modified anode 602. Additionally or alternatively, the anti-reflective layer 604 may be coupled to the substrate (e.g., coupled to the first substrate portion 312). The anti-reflective layer 604 may aid in shepherding photons that passed unabsorbed through the substrate out of the device 612 (e.g., may couple light passing through the substrate to an exterior of the device 612). In other words, the anti-reflective layer 604 may prevent unabsorbed light from undergoing internal reflections (either from a surface of the substrate and/or a surface of an electrode), such that the light is not reflected back into the interior of the device 612. Because the anti-reflective layer 604 reduces the amount of time light is travelling through the substrate of the device 612, the time and distance over which optical absorption can occur is also reduced, thereby reducing the probability of photoexcitation and the time scale over which photoexcitation occurs. Thus, the number of minority carriers photoexcited in the substrate will be reduced overall. Because the number of photoexcited minority carriers is reduced, the dark current arising from such minority carriers may be mitigated.

Figure 7A:
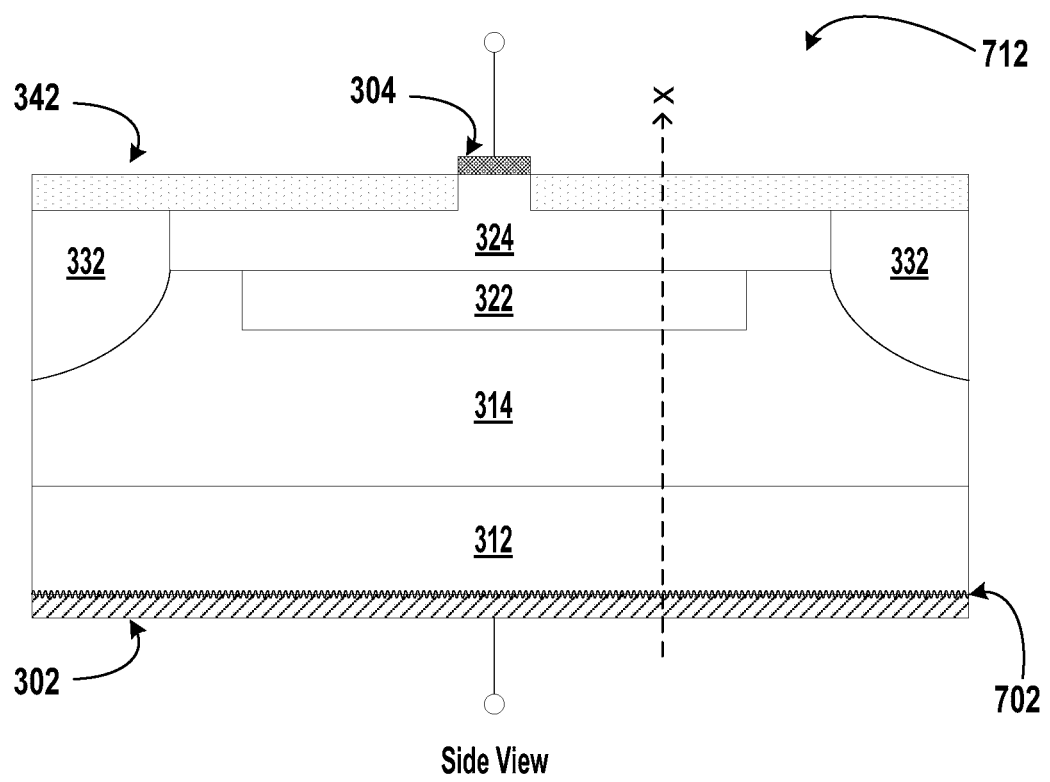
FIG. 7A is an illustration of a device, according to example embodiments.

FIG. 7A is an illustration of a device 712, according to example embodiments. The device 712 may be analogous to the photodetector 212 illustrated in FIG. 3A. As such, the device 712 may include an anode 302, a cathode 304, a first substrate portion 312, a second substrate portion 314, a p-n junction (formed between a heavily doped p-side 322 and a heavily doped n-side 324), guardring regions 332, and a protective layer 342. Each of the previously recited components may be substantially the same or identical to the corresponding components shown and described with respect to FIG. 3A.

However, unlike the photodetector 212 illustrated in FIG. 3A, the device 712 includes surface roughness 702 (e.g., corresponding to surface defects) on a bottom surface of the first substrate portion 312. The surface roughness 702 may be a modification applied to the first substrate portion 312 during fabrication of the device 712 prior to coupling the first substrate portion 312 to the anode 302. Additionally or alternatively, in some embodiments, other surfaces (e.g., side surfaces or a top surface) of the first substrate portion 312 may include roughness. Further, in addition to or instead of the first substrate portion 312 including surface roughness 702, in some embodiments, the second substrate portion 314 may include surface roughness on one or more surfaces. Surface defects resulting from surface roughness may include topological defects, defects where a translation symmetry of the surface is broken, adsorbates (e.g., sodium or magnesium), interfaces with other materials, inconsistent grain boundaries, stacking faults, antiphase boundaries, or dangling bonds, for example.

Figure 7B:
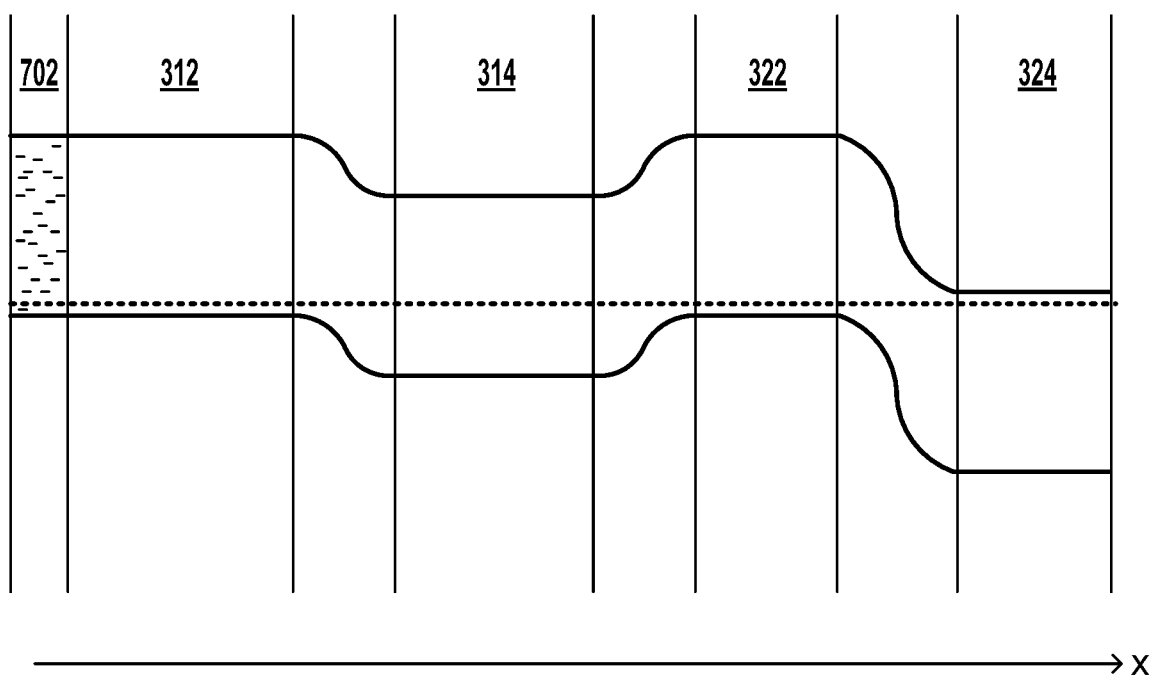
FIG. 7B is a band diagram of the device illustrated in FIG. 7A, according to example embodiments.

FIG. 7B is a band diagram of the device 712 illustrated in FIG. 7A, according to example embodiments. The surface roughness 702 may generate one or more interfacial states and/or trap strates, as illustrated. These trap states may be accessed by minority carriers during a two-step (or multi-step) recombination process. Such recombination processes may be alternative mechanisms by which minority carriers can recombine (in addition to traditional recombination processes present in the substrate). As such, the probability of recombination of minority carriers may increase. Thus, minority carriers that are photoexcited within the substrate may more readily recombine, thereby reducing the number of photoexcited minority carriers present in the substrate. Because of this, fewer minority carriers may ultimately reach the p-n junction, thereby mitigating the dark current arising from minority carriers photoexcited in the substrate. Said a different way, the minority carrier lifetime of photoexcited minority carriers may be reduced due to the interfacial and/or trap states. Correspondingly, based on the following relations, the diffusion length of the minority carriers may decrease, thereby reducing the number of minority carriers reaching the p-n junction:

$$L_n = \sqrt{D_n \tau_n}$$

$$L_p = \sqrt{D_p \tau_p}$$

where $L_n/L_p$ represent minority carrier diffusion lengths, $D_n/D_p$ represent minority carrier diffusion constants, and $\tau_n/\tau_p$ represent minority carrier lifetimes.

In addition or instead of surface roughness 702, in some embodiments, the device 712 may include trap states within a bulk region of the first substrate portion 312 and/or a bulk region of the second substrate portion 314. For example, gold, platinum, and/or or xenon may be incorporated into the device 712 to dope certain regions of the first substrate portion 312 and/or the second substrate portion 314. Gold may introduce a donor level 0.35 eV above the valence band of the surrounding silicon and/or an acceptor level 0.54 below the conduction band of the surrounding silicon, in example embodiments. Likewise, platinum may introduce a donor level 0.35 eV above the valence band of the surrounding silicon and/or an acceptor level 0.26 eV below the conduction band of the surrounding silicon, in example embodiments. Other dopant materials are possible and contemplated herein.

Additionally or alternatively, crystallographic defects that give rise to trap states may be present within the bulk region of the first substrate portion 312 and/or the second substrate portion 314. Such crystallographic defects may include vacancy defects, interstitial defects, Frenkel defects, antisite defects, substitutional defects, or topological defects, for example. Further, such crystallographic defects may be created using ion implantation (e.g., without thermal annealing or with partial thermal annealing to control the extent of the damage without completely negating it). Alternatively, such crystallographic defects may be inherently present within the bulk region of the first substrate portion 312 (i.e., the first substrate portion 312 may be a "dirty substrate" region). In such embodiments, the second substrate portion 314 may then be epitaxially grown on the first substrate portion 312 such that the second substrate portion 314 has far fewer crystallographic defects than the first substrate portion 312.

Analogously to the trap and/or interface states arising due to surface roughness 702, as described above, such intermediate states may reduce the minority carrier lifetime, thus reducing the minority carrier diffusion length, which ultimately reduces the number of photoexcited minority carriers that reach the p-n junction. Hence, trap states within the bulk region of the first substrate portion 312 and/or the second substrate portion 314 may also be used to mitigate the dark current arising from minority carriers photoexcited in the substrate.

The trap and/or interface states (whether introduced by crystallographic defects, surface roughness, or other mechanisms) introduced into the substrate may be defined at a predetermined depth. The predetermined depth may be determined based on a desired photon detection efficiency and/or a desired diffusion profile for the minority carriers in the substrate. For example, the predetermined depth may be large enough (i.e., the trap and/or interface states may be located far enough from the p-n junction) such that the photon detection efficiency is not substantially adversely affected by the trap and/or interface states. Additionally or alternatively, the predetermined depth may be small enough (i.e., the trap and/or interface states may be located close enough to the p-n junction) such that the dark current arising from the minority carriers photoexcited in the substrate is sufficiently mitigated.

Figure 8A:
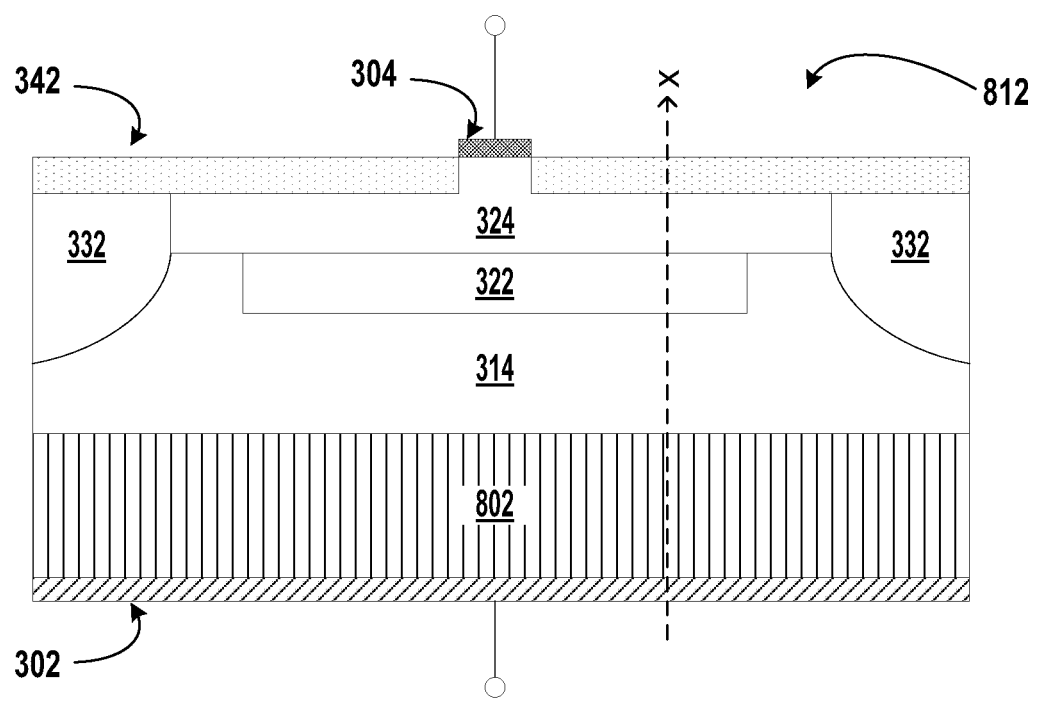
FIG. 8A is an illustration of a device, according to example embodiments.

FIG. 8A is an illustration of a device 812, according to example embodiments. The device 812 may be analogous to the photodetector 212 illustrated in FIG. 3A. As such, the device 812 may include an anode 302, a cathode 304, a second substrate portion 314, a p-n junction (formed between a heavily doped p-side 322 and a heavily doped n-side 324), guardring regions 332, and a protective layer 342. Each of the previously recited components may be substantially the same or identical to the corresponding components shown and described with respect to FIG. 3A.

However, unlike the photodetector 212 illustrated in FIG. 3A, the first substrate portion 312 of the photodetector 212 may be replaced with a heterogeneous substrate portion 802. Unlike the first substrate portion 312 in FIG. 3A, the heterogeneous substrate portion 802 in the device 812 may be made of a different material than the other materials in the device 812. Particularly, the material of the heterogeneous substrate portion 802 may be different than the material of the second substrate portion 314. For example, if the second substrate portion 314, the heavily doped p-side 322, the heavily doped n-side 324, and the guardring regions 332 each include doped or undoped Si, the heterogeneous substrate portion 802 may include a different semiconductor material such as doped or undoped GaAs or doped or undoped Ge. Other semiconductor materials besides GaAs and Ge are also possible. As such, both the device 812 and its corresponding band diagram include a heterostructure.

The different semiconductor material may be selected based on its bandgap and/or based on the photon energy of the light being emitted from the light source, which is irradiating the device 812. In some embodiments, the different semiconductor material may be selected such that light of a given photon energy being emitted from the light source will not be absorbed within the heterogeneous substrate portion 802 (i.e., photoexcitation will not occur in the heterogeneous substrate portion 802). For example, if the light source is emitting infrared light with a wavelength of 1.0 μm (corresponding to an energy of 1.24 eV), that light may be readily absorbed by silicon, which has a bandgap of about 1.12 eV at 300 K. Hence, such light can cause photoexcitation in the second substrate portion 314, the heavily doped p-side 322, and the heavily doped n-side 324 (assuming those regions are made of silicon). However, in order to prevent photoexcitation from occurring within the heterogeneous substrate portion 802, a material with a bandgap of greater than 1.24 eV may be selected. For example, the heterogeneous substrate portion 802 may be made of GaAs (doped or undoped), which has a bandgap of about 1.424 eV at 300 K. In alternate embodiments, rather than GaAs, other semiconductor materials could be used (e.g., doped or undoped InP, doped or undoped GaP, doped or undoped CdSe, doped or undoped CdTe, doped or undoped ZnO, doped or undoped ZnS, etc.) or insulating materials could be used (e.g., $Al_2O_3$).

By including a material in the substrate (e.g., in the heterogeneous substrate portion 802) that does not absorb light emitted from the light detector (e.g., a material with a bandgap above the photon energy of the light emitted from the light detector), photoexcitation can be prevented within the heterogeneous substrate portion 802. Preventing photoexcitation of minority carriers within the substrate reduces the total number of photoexcited minority carriers across the entire substrate, thereby mitigating the dark current (e.g., the dark diffusion current from the minority carriers photoexcited in the substrate) after an illumination event. In addition, because minority carriers are not photoexcited in the heterogeneous substrate portion 802, the maximum distance from the p-n junction, and likewise the maximum depth of the device 812, at which photoexcitation can occur is decreased. In other words, each minority carrier that is photoexcited within the device 812 is within a given distance of the p-n junction. This may limit the number of photoexcited minority carriers with long diffusion lengths from meandering to the p-n junction (and resulting in output signal) substantially after an illumination event. In other words, this may provide another mechanism that limits the "long tail" of the detection curve by mitigating the dark current.

In alternate embodiments, one or more other portions of a device may include a heterogeneous portion. For example, part or all of the second substrate portion 314 may be replaced with materials that are different from the material in the heavily doped p-side 322 and/or the heavily doped n-side 324. Similarly, part or all of the p-n junction may be replaced with materials that are different from the material in the second substrate portion 314.

Figure 8B:
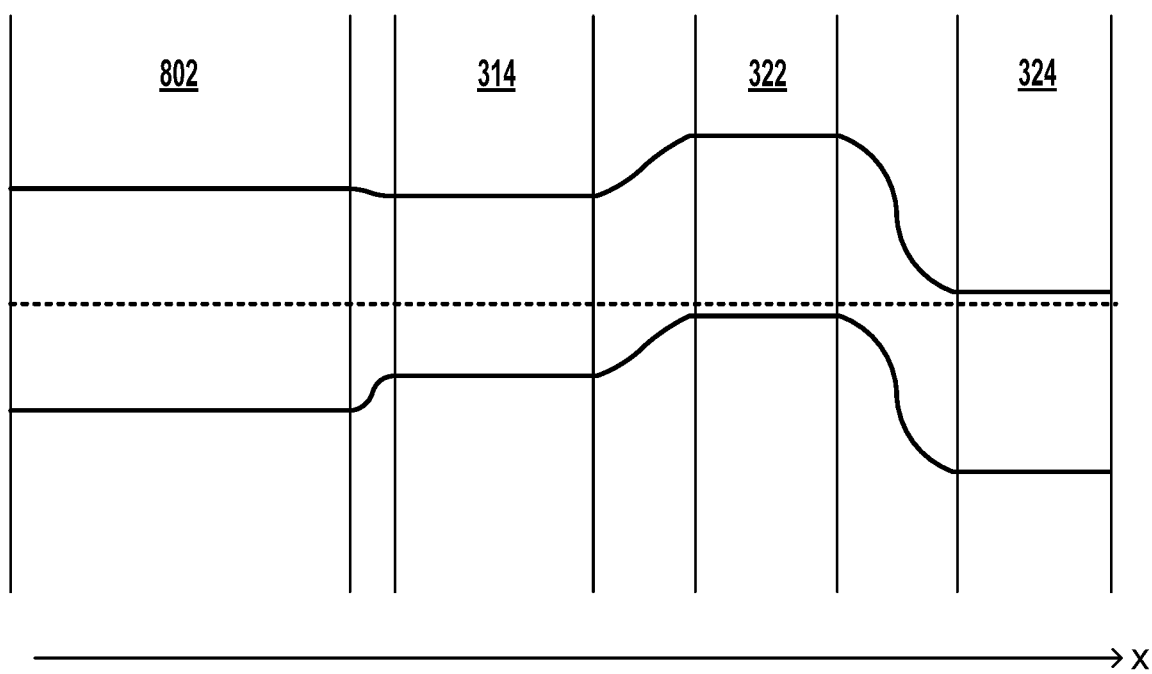
FIG. 8B is a band diagram of the device illustrated in FIG. 8A, according to example embodiments.

FIG. 8B is a band diagram of the device 812 illustrated in FIG. 8A, according to example embodiments. For example, the band diagram of FIG. 8B illustrates an embodiment where the second substrate portion 314, the heavily doped p-side 322, and the heavily doped n-side 324 each include silicon with different dopants/doping concentrations and where the heterogeneous substrate portion 802 includes GaAs. As illustrated, the bandgap of the heterogeneous substrate portion 802 is larger than the bandgap of the second substrate portion 314, the heavily doped p-side 322, and the heavily doped n-side 324.

Other ways of modifying the band diagram, in addition to or instead of incorporating a heterostructure, may also serve to mitigate dark current arising from minority carriers photoexcited in the substrate. For example, the p-n junction in a device may be designed to introduce an electric field (e.g., based on a curvature of a conduction band or valence band of the band structure) that extends farther down the junction, wherein the electric field accelerates excess minority carriers moving towards the p-n junction. Hence, those excess minority carriers will move more quickly to the p-n junction, which will reduce the length of the "long tail" illustrated in FIG. 3B.

Figure 9A:
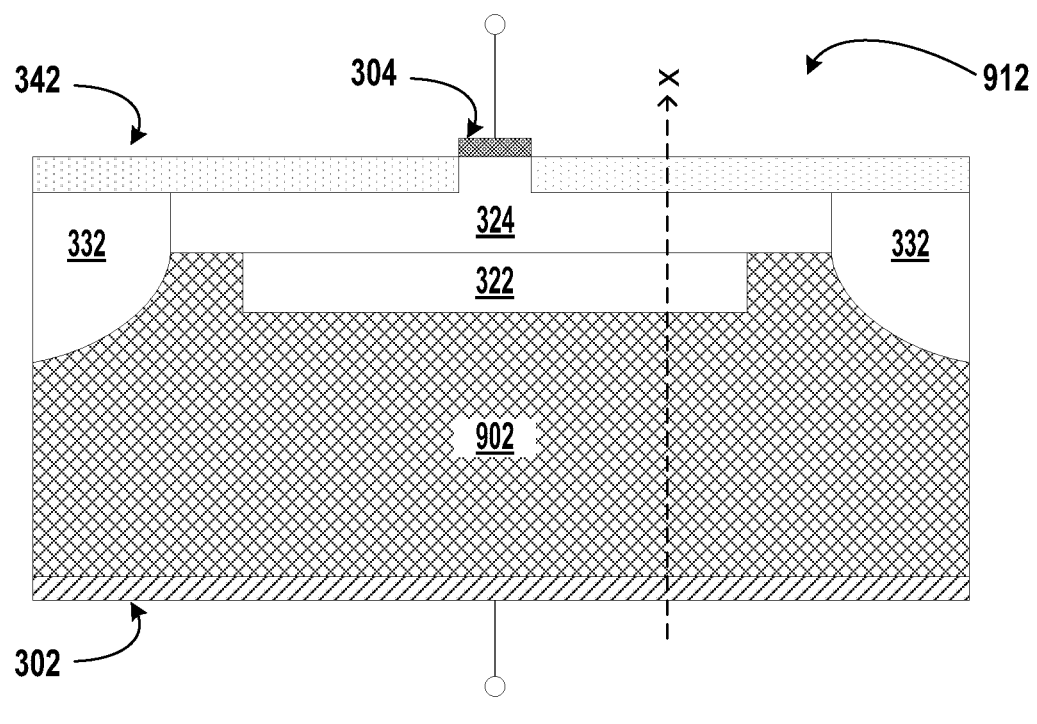
FIG. 9A is an illustration of a device, according to example embodiments.

FIG. 9A is an illustration of a device 912, according to example embodiments. The device 912 may be analogous to the photodetector 212 illustrated in FIG. 3A. As such, the device 912 may include an anode 302, a cathode 304, a p-n junction (formed between a heavily doped p-side 322 and a heavily doped n-side 324), guardring regions 332, and a protective layer 342. Each of the previously recited components may be substantially the same or identical to the corresponding components shown and described with respect to FIG. 3A.

However, unlike the photodetector 212 illustrated in FIG. 3A, instead of the first substrate portion 312 and the second substrate portion 314, the device 912 in FIG. 9A may include a graded substrate portion 902. The graded substrate portion 902 may be variably doped throughout. For example, the graded substrate portion 902 may be doped based on a doping profile that varies with respect to depth (x). The graded substrate portion 902 may include a single material, in some embodiments. In other embodiments, the graded substrate portion 902 may include two or more materials (i.e., the graded substrate portion 902 may be a heterostructure).

Figure 9B:
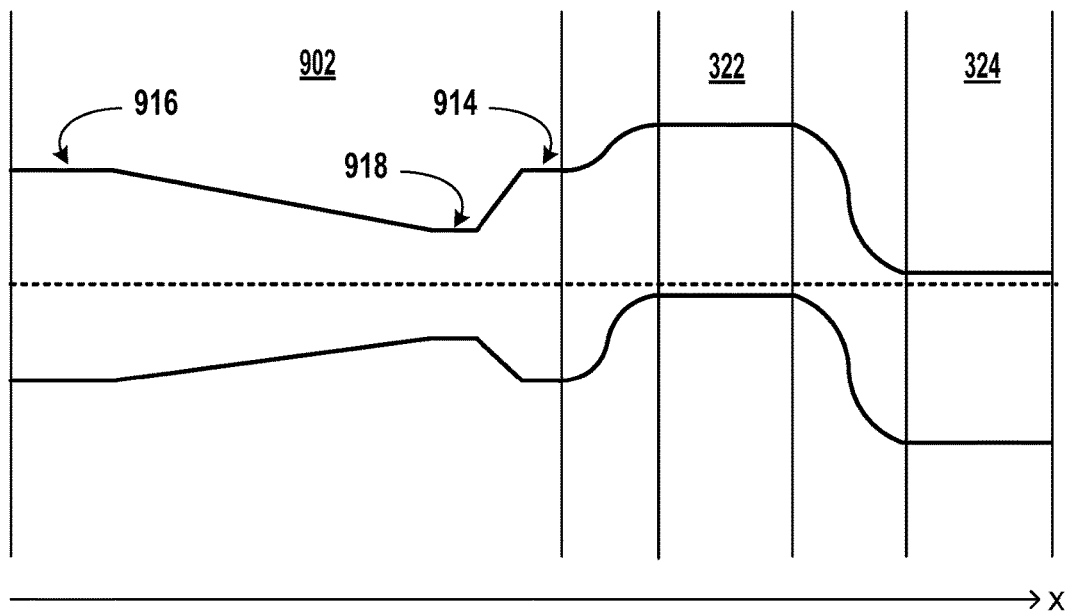
FIG. 9B is a band diagram of the device illustrated in FIG. 9A, according to example embodiments.

FIG. 9B is a band diagram of the device 912 illustrated in FIG. 9A, according an example embodiment of the device 912. For example, as illustrated in FIG. 9B, the graded substrate portion 902 may be heterostructured where the composition of the materials are varied (e.g., based on a material composition profile) with respect to depth. For example, the graded substrate portion 902 may include GaAs and GaSb (whereas the heavily doped p-side 322 and the heavily doped n-side 324 may include silicon). GaAs may have a bandgap of about 1.424 eV at 300 K and GaSb may have a band gap of about 0.68 eV at 300 K. The graded substrate portion 902 may also include, as illustrated, hybrids that are $GaAs_zSb_{1-z}$, where z represents the proportion of the material that is arsenide and 1-z represents the proportion of the material that is antimonide. It is understood that other materials (both single-material structures and heterostructures) are contemplated herein. For example, SiGe could be used.

As shown, a first portion 914 of the graded substrate portion 902 nearest the heavily doped p-side 322 may be $GaAs_1Sb_0$ (i.e., GaAs), a second portion 916 of the graded substrate portion 902 nearest a surface of the graded substrate portion 902 (e.g., a bottom surface of the graded substrate portion 902) may also be $GaAs_1Sb_0$ (i.e., GaAs), and in an intermediate region 918 (e.g., nearer to the heavily doped p-side 322 than the bottom side of the graded substrate portion 902) the graded substrate portion 902 may be $GaAs_0Sb_1$ (i.e., GaSb). In between those three distinct regions, the arsenide and antimonide in the graded substrate portion 902 is varied linearly. It is understood that other gradings with other materials (e.g., besides GaAs and GaSb) are also possible. Further, it is also understood that rather than a linear grading profile, an exponential grading, logarithmic grading, or any other type of grading profile could be used. Yet further, while binary and ternary III-V semiconductor compounds are expressly recited herein, it will be understood that quaternary compounds and II-VI semiconductor compounds are also contemplated and possible.

Figure 9C:
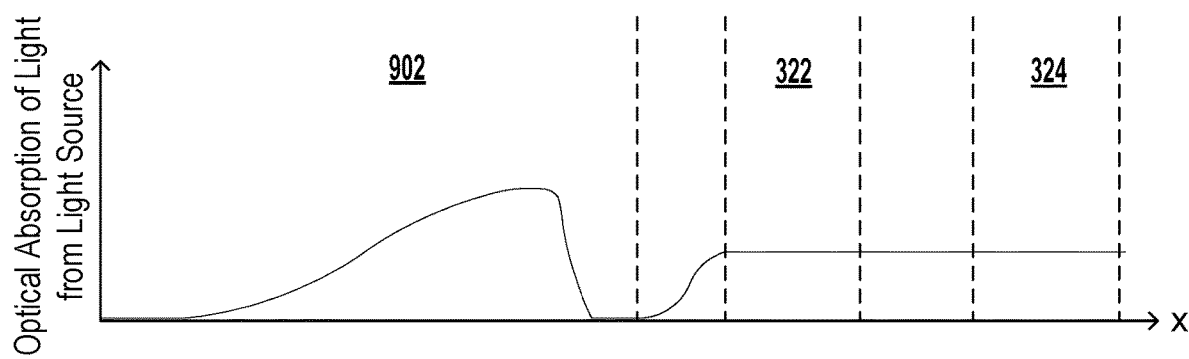
FIG. 9C is a plot of optical absorption with respect to depth of the device illustrated in FIG. 9A having the band diagram illustrated in FIG. 9B, according to example embodiments.

FIG. 9C is a plot of optical absorption with respect to depth of the device 912 illustrated in FIG. 9A having the band diagram illustrated in FIG. 9B, according to example embodiments. As shown, the graded substrate portion 902 can be used define certain regions of high absorption (e.g., relatively high photoexcitation of minority carriers), as well as certain regions of low absorption (e.g., relatively little photoexcitation of minority carriers).

Again, if a light source irradiating the device 912 is transmitting light with a wavelength of 1 μm (corresponding to a photon energy of 1.24 eV), the GaSb and some intermediate values of $GaAs_zSb_{1-z}$ may be capable of absorbing that light, whereas the GaAs and some other intermediate values of $GaAs_zSb_{1-z}$ might not be. Thus, in regions with a narrow bandgap (e.g., regions having a higher Sb concentration and a lower As concentration), more light absorption/photoexcitation of minority carriers may occur. As such, the graded substrate portion 902 can be used to define where and in what quantities minority carriers are being photoexcited in the substrate. As such, the overall number of photoexcited minority carriers can be reduced. Additionally, the regions in which photoexcited minority carriers are excited can be limited to a distance that is close enough to the p-n junction such that the minority carriers will diffuse to the p-n junction within a reasonable time (e.g., thereby decreasing the time decay constant associated with each illumination event). Both of these factors are mechanisms by which the use of a graded substrate portion 902 can mitigate dark current arising from minority carriers photoexcited in the substrate.

In addition to impacting absorption behavior, a graded substrate portion 902 (both graded composition and graded doping) may influence drift current and/or diffusion current toward or away from the p-n junction. As is understood, the graded substrate portion 902 thereby has an additional mechanism to mitigate dark current arising from minority carriers photoexcited in the substrate.

Figure 10:
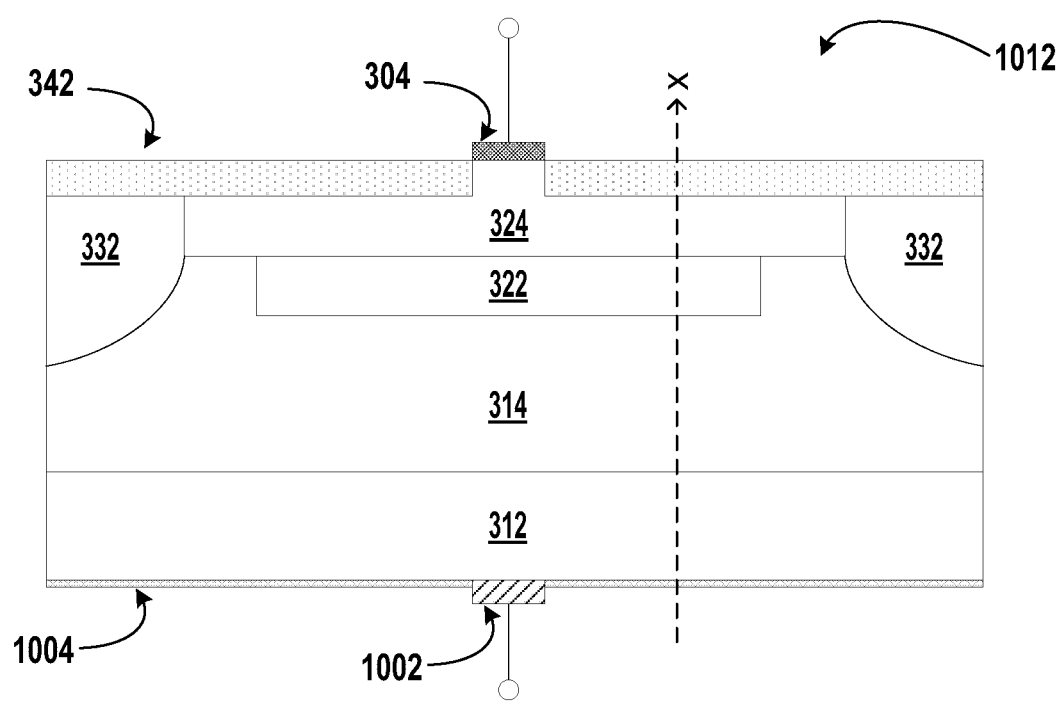
FIG. 10 is an illustration of a device, according to example embodiments.

FIG. 10 is an illustration of a device 1012, according to example embodiments. The device 1012 may be analogous to the photodetector 212 illustrated in FIG. 3A. As such, the device 1012 may include may include a cathode 304, a first substrate portion 312, a second substrate portion 314, a p-n junction (formed between a heavily doped p-side 322 and a heavily doped n-side 324), guardring regions 332, and a protective layer 342. Each of the previously recited components may be substantially the same or identical to the corresponding components shown and described with respect to FIG. 3A.

However, unlike the photodetector 212 illustrated in FIG. 3A, the device 1012 may include a modified anode 1002 and polished/planarized surface 1004. The modified anode 1002 may have a reduced size, as illustrated. Similar to the cathode 304, the modified anode 1002 may be sized such that light can be transmitted around the modified anode 1002. Unlike the anode 302 illustrated in FIG. 3A, which may completely cover an entire bottom surface of the first substrate portion 312, the modified anode 1002 may only cover a portion of the bottom surface of the first substrate portion 312.

The polished/planarized surface 1004 may be a surface of the first substrate portion 312 that is polished and/or planarized. The polished/planarized surface 1004 may aid in shepherding photons that passed unabsorbed through the substrate out of the device 1012 (e.g., may couple light passing through the substrate to an exterior of the device 1012). In other words, the polished/planarized surface 1004 may prevent unabsorbed light from undergoing internal reflections (either from a surface of the substrate and/or a surface of an electrode), such that the light is not reflected back into the interior of the device 1012. Because the polished/planarized surface 1004 reduces the amount of time light is travelling through the substrate of the device 1012, the time and distance over which optical absorption can occur is also reduced, thereby reducing the probability of photoexcitation and the time scale over which photoexcitation occurs. Thus, the number of minority carriers photoexcited in the substrate will be reduced overall. Because the number of photoexcited minority carriers is reduced, the dark current arising from such minority carriers may be mitigated. In some embodiments, in addition to or instead of the polished/planarized surface 1004 being polished and/or planarized, other surfaces of the device 1012 (e.g., side surfaces of the first substrate portion 312) may be polished and/or planarized.

Figure 11A:
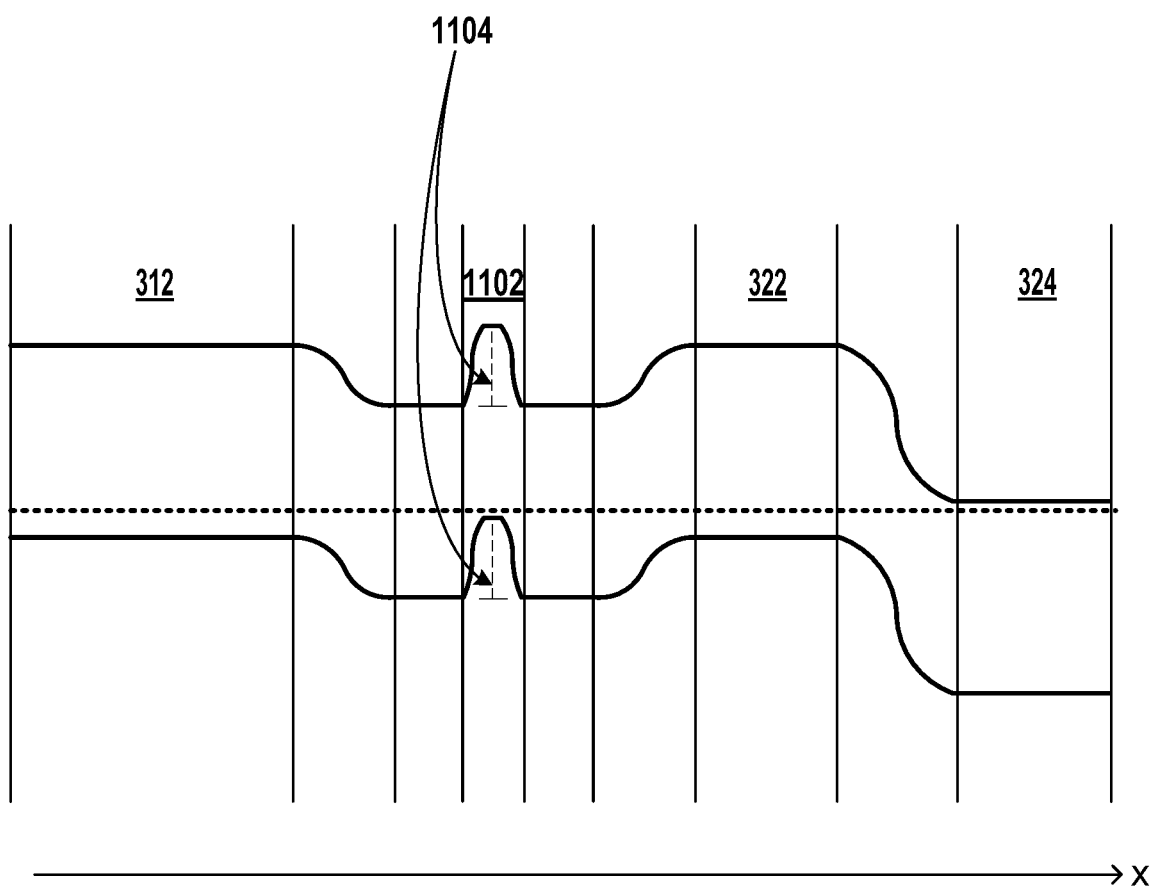
FIG. 11A is a band diagram of a device having a potential barrier, according to example embodiments.

FIG. 11A is a band diagram of a device having a potential barrier, according to example embodiments. The device may be similar to the photodetector 212 illustrated in FIG. 3A, for example. However, the doping profile of the second substrate portion in FIG. 11A may be different than the doping profile of the second substrate portion 314 of the photodetector 212 (as illustrated in FIG. 3B). For example, in FIG. 11A, the second substrate portion is not uniformly doped, unlike the second substrate portion 314 as illustrated in FIG. 3B.

As illustrated, a region of the second substrate portion in FIG. 11A is strongly p-doped (e.g., p+-doped or p++-doped). This strongly p-doped region gives rise to a potential barrier 1102 within the band structure of FIG. 11A. Such a potential barrier 1102 may be configured to prevent minority carriers from reaching a depletion region (e.g., within the p-n junction) of the device due to diffusion. A barrier thickness corresponding to the potential barrier 1102 may be at least 1 nm thick, at least 10 nm thick, or at least 100 nm thick, in various embodiments.

The conduction band of the potential barrier 1102 may be separated from (e.g., lie above) the conduction band of the surrounding bulk substrate by a positive energy offset 1104. Similarly, the valence band of the potential barrier 1102 may be separated from (e.g., lie above) the valence band of the surrounding bulk substrate by the positive energy offset 1104. The positive energy offset 1104 could have a value of at least 0.01 times the band gap of the bulk substrate, at least 0.05 times the band gap of the bulk substrate, at least 0.1 times the band gap of the bulk substrate, at least 0.15 times the band gap of the bulk substrate, at least 0.2 times the band gap of the bulk substrate, at least 0.25 times the band gap of the bulk substrate, at least 0.5 times the band gap of the bulk substrate, at least 0.75 times the band gap of the bulk substrate, or at least 1.0 times the band gap of the bulk substrate, in various embodiments. In example embodiments where the bulk substrate is made of silicon, this may correspond to at least 0.28 eV, at least 0.56 eV, at least 0.84 eV, or at least 1.12 eV, respectively, at 300 K. In alternate embodiments (e.g., embodiments where the bulk substrate is primarily n-type, rather than p-type), the positive energy offset 1104 of the potential barrier 1102 may be larger.

Figure 11B:
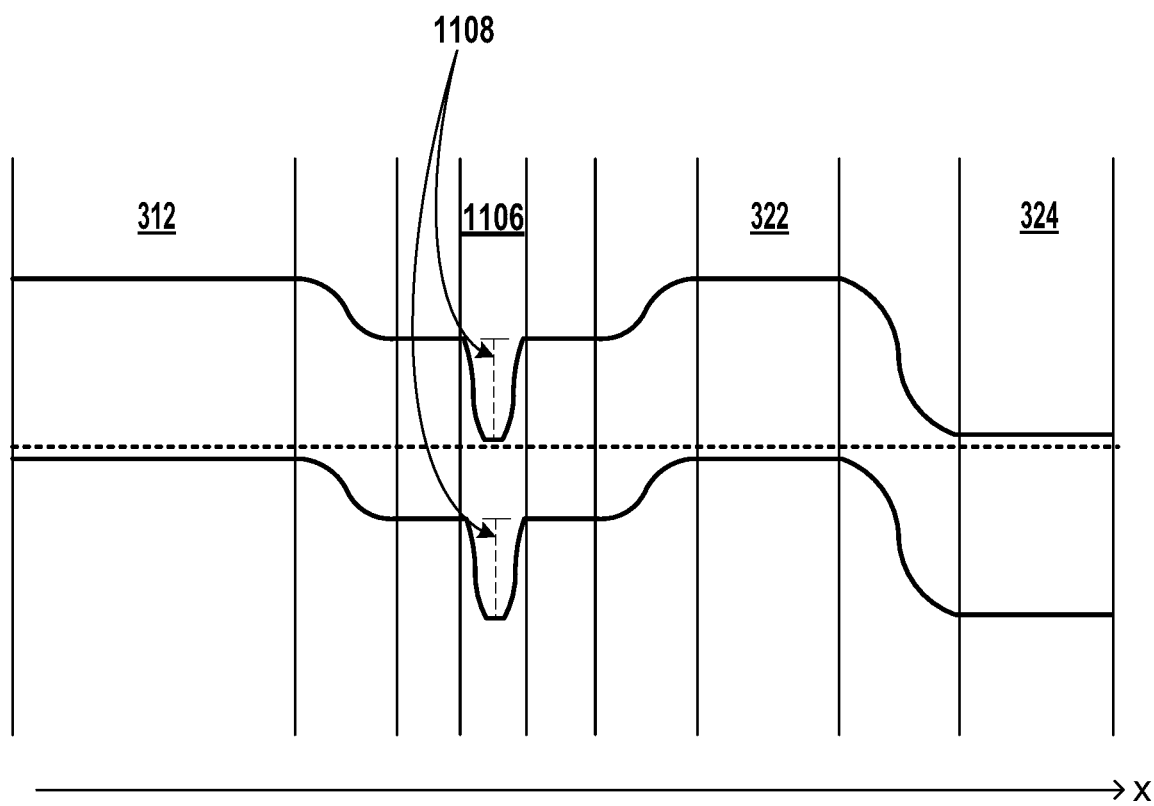
FIG. 11B is a band diagram of a device having a potential well, according to example embodiments.

FIG. 11B is a band diagram of a device having a potential well, according to example embodiments. The device may be similar to the photodetector 212 illustrated in FIG. 3A, for example. However, the doping profile of the second substrate portion in FIG. 11B may be different than the doping profile of the second substrate portion 314 of the photodetector 212 (as illustrated in FIG. 3B). For example, in FIG. 11B, the second substrate portion is not uniformly doped, unlike the second substrate portion 314 as illustrated in FIG. 3B.

As illustrated, a region of the second substrate portion in FIG. 11B is strongly n-doped (e.g., n+-doped or n++-doped). This strongly n-doped region gives rise to a potential well 1106 within the band structure of FIG. 11B. Such a potential well 1106 may be configured to prevent minority carriers from reaching a depletion region (e.g., within the p-n junction) of the device due to diffusion. A well thickness corresponding to the potential well 1106 may be at least 1 nm thick, at least 10 nm thick, or at least 100 nm thick, in various embodiments.

The conduction band of the potential well 1106 may be separated from (e.g., lie below) the conduction band of the surrounding bulk substrate by a negative energy offset 1108. Similarly, the valence band of the potential well 1106 may be separated from (e.g., lie below) the valence band of the surrounding bulk substrate by the negative energy offset 1108. The negative energy offset 1108 could have a value of at least 0.01 times the band gap of the bulk substrate, at least 0.05 times the band gap of the bulk substrate, at least 0.1 times the band gap of the bulk substrate, at least 0.15 times the band gap of the bulk substrate, at least 0.2 times the band gap of the bulk substrate, at least 0.25 times the band gap of the bulk substrate, at least 0.5 times the band gap of the bulk substrate, at least 0.75 times the band gap of the bulk substrate, or at least 1.0 times the band gap of the bulk substrate, in various embodiments. In example embodiments where the bulk substrate is made of silicon, this may correspond to at least 0.28 eV, at least 0.56 eV, at least 0.84 eV, or at least 1.12 eV, respectively, at 300 K. In alternate embodiments (e.g., embodiments where the bulk substrate is primarily n-type, rather than p-type), the negative energy offset 1108 of the potential barrier 1102 may be smaller.

IV. Example Processes

Figure 12:
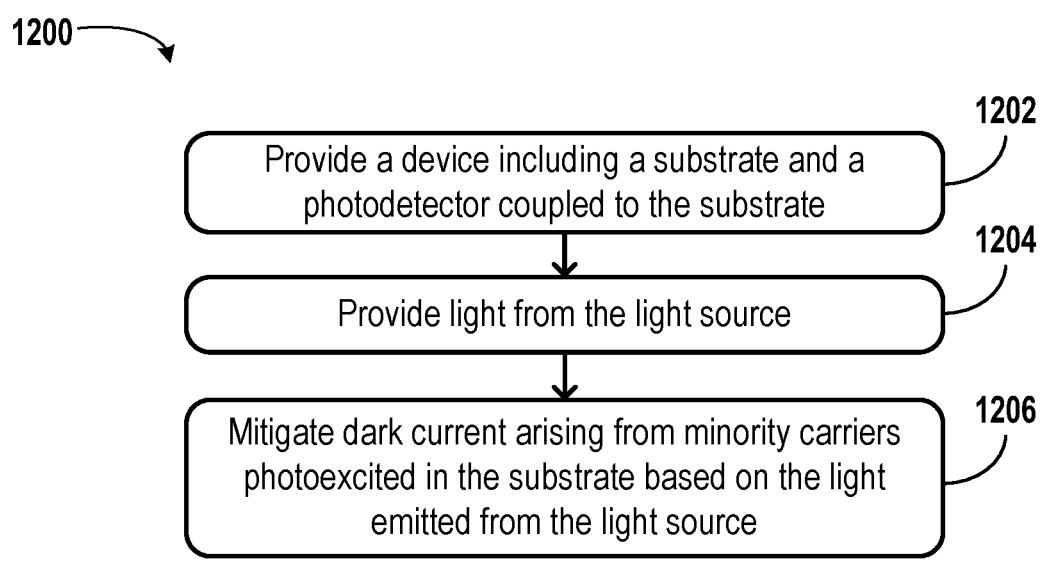
FIG. 12 is a flowchart diagram illustrating a method, according to example embodiments.

FIG. 12 is a flowchart diagram of a method 1200, according to example embodiments.

At block 1202, the method 1200 includes providing a device including a substrate and a photodetector coupled to the substrate. The photodetector is arranged to detect light emitted from a light source that irradiates a top surface of the device.

At block 1204, the method 1200 includes providing light from the light source.

At block 1206, the method 1200 includes mitigating dark current arising from minority carriers photoexcited in the substrate based on the light emitted from the light source. In some embodiments, mitigating the dark current may include providing light from the light source such that the light from the light source irradiates a bottom surface of the device (e.g., in embodiments where the device is flip-chip bonded to a ROIC). This may allow for a device with a thinner substrate to be used, which would reduce an amount of photoexcited minority carriers in the substrate, thereby reducing the number of minority carriers that reach the p-n junction after the illumination event.

Additionally or alternatively, mitigating the dark current may include modifying an operating temperature of the device. Modifying the operating temperature of the device may mitigate the dark current by modifying the diffusion length of minority carriers within the substrate (e.g., minority carriers photoexcited in the substrate). The diffusion length of minority carriers is dependent on minority carrier diffusion constant ($D_n/D_p$) and minority carrier lifetime ($\tau_n/\tau_p$), as described above. Minority carrier diffusion constant can be defined by the following relations (i.e., the Einstein relations):

$$D_n = \frac{\mu_n kT}{q}$$

$$D_p = \frac{\mu_p kT}{q}$$

where $\mu_n/\mu_p$ are the minority carrier mobilities, k is Boltzmann's constant, T is the absolute temperature, and q is the electrical charge of the minority carrier. Further, minority carrier mobility, itself, is temperature dependent. In general, minority carrier mobility decreases with increasing temperature, and in a fashion that overcompensates for the linear temperature factor in the equation above. Hence, in general, minority carrier diffusion constant decreases with increasing temperature. Thus, modifying the operating temperature to mitigate the dark current may include increasing the operating temperature of the device, thereby reducing the minority carrier diffusion constant and, in turn, reducing the minority carrier diffusion length. If the diffusion length is decreased, the number of minority carriers photoexcited in the substrate that can ultimately reach the p-n junction is reduced, thereby reducing the "long tail" of the illumination event.

Still further, in some embodiments, mitigating the dark current may include modulating a wavelength of the light emitted from the light source. For example, modulating the wavelength may include increasing the wavelength of the light emitted. Increasing the wavelength of the light emitted may correspond to a reduction in the associated photon energy of the light emitted. If the associated photon energy is reduced, the amount of light absorbed in the substrate may be reduced or eliminated (e.g., if the bandgap of the substrate material is greater than the photon energy of the light emitted). If the amount of light absorbed in the substrate is reduced or eliminated, the number of photoexcited minority carriers may be reduced or eliminated. Reducing the number of minority carriers photoexcited in the substrate may reduce the number of minority carriers that diffuse to the p-n junction after an illumination event, thereby reducing the "long tail" of the illumination event.

Alternatively, modulating the wavelength may include decreasing the wavelength of the light emitted. Decreasing the wavelength of the light emitted may reduce the depth into the substrate that the photons penetrate before being absorbed (e.g., the absorption depth in silicon may be around 100 µm for wavelengths around 1 µm whereas the absorption depth in silicon may only be around 100 nm for wavelengths around 400 nm). By decreasing the absorption depth of the emitted light, the number of minority carriers that are photoexcited within the substrate relatively far from the p-n junction (e.g., far enough from the p-n junction that they take an extended time to diffuse to the p-n junction) may be reduced or eliminated. If the amount of minority carriers photoexcited within the substrate relative far from the p-n junction is reduced or eliminated, the number of photoexcited minority carriers that reach the p-n junction significantly after an illumination event may be reduced or eliminated, thereby reducing the "long tail" of the illumination event.

In addition, mitigating the dark current may include modulating a power of the light emitted from the light source. Modulating the power of the light emitted from the light source may include reducing the power of the light from the light source. Reducing the power of the light from the light source may correspond to fewer photons irradiating the device. By reducing the number of photons irradiating the device, the number of photons that are transmitted to the substrate may be reduced in turn. Such a reduction of photons transmitted to the substrate may reduce absorption in the substrate, thereby reducing the amount of minority carriers photoexcited in the substrate. Reducing the number of minority carriers photoexcited in the substrate may reduce the number of minority carriers that diffuse to the p-n junction after an illumination event, thereby reducing the "long tail" of the illumination event.

Even further, mitigating the dark current may include modulating a pulse frequency or duty cycle of the light emitted from the light source. In some embodiments, modulating a pulse frequency or duty cycle of the light emitted from the light source may include switching from a continuous-wave (CW) operating mode to a pulsed operating mode. Similarly, modulating a pulse frequency or duty cycle of the light emitted from the light source may include swapping a CW light source for a pulsed light source. Additionally or alternatively, modulating the pulse frequency of the light emitted from the light source may include reducing the pulse frequency of the light emitted from the light source. Similarly, modulating the duty cycle of the light emitted from the light source may include reducing the duty cycle of the light emitted from the light source. Reducing the pulse frequency or reducing the duty cycle of the light emitted from the light source may correspond to fewer photons irradiating the device. By reducing the number of photons irradiating the device, the number of photons that are transmitted to the substrate may be reduced in turn. Such a reduction of photons transmitted to the substrate may reduce absorption in the substrate, thereby reducing the amount of minority carriers photoexcited in the substrate. Reducing the number of minority carriers photoexcited in the substrate may reduce the number of minority carriers that diffuse to the p-n junction after an illumination event, thereby reducing the "long tail" of the illumination event.

Figure 13:
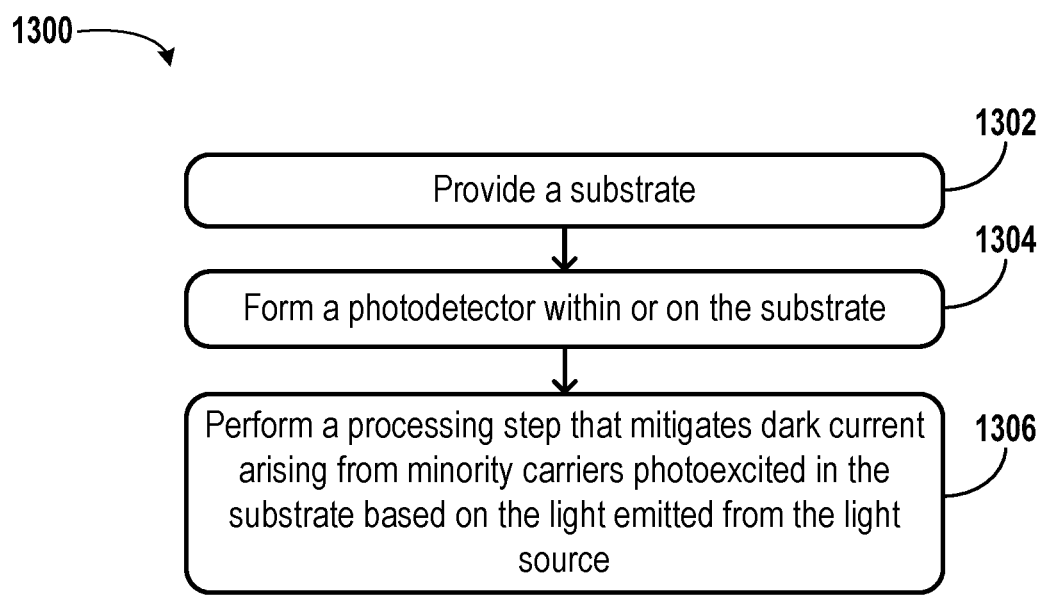
FIG. 13 is a flowchart diagram illustrating a method, according to example embodiments.

FIG. 13 is a flowchart diagram of a method of manufacture 1300, according to example embodiments.

At block 1302, the method of manufacture 1300 includes providing a substrate.

At block 1304, the method of manufacture 1300 includes forming a photodetector within or on the substrate. The photodetector is arranged to detect light emitted from a light source that irradiates a top surface of the photodetector.

At block 1306, the method of manufacture 1300 includes performing a processing step that mitigates dark current arising from minority carriers photoexcited in the substrate based on the light emitted from the light source. In some embodiments, performing the processing step that mitigates dark current may include thinning the substrate by removing a portion of the substrate, thereby reducing a depth of the substrate to less than or equal to 100 times a diffusion length of a minority carrier within the substrate. Further, performing the processing step that mitigates dark current may include producing crystallographic defects within the substrate that allow for recombination of electrons and holes (e.g., through trap-assisted recombination at trap states).

Additionally or alternatively, performing the processing step that mitigates dark current may include defining a band structure based on a material composition of the substrate and the photodetector. In such embodiments, the band structure may induce an electric field that extends beyond a depletion region of the photodetector based on a curvature of a conduction band or a valence band of the band structure beyond the depletion region of the photodetector. Such an electric field may be configured to induce a drift current that accelerates minority carriers toward the depletion region of the photodetector when minority carriers are photoexcited in the substrate based on the light emitted from the light source. For example, the p-n junction in a device may be designed to introduce an electric field that extends farther down the junction, wherein the electric field accelerates excess minority carriers moving towards the p-n junction.

In some embodiments, the band structure may include a potential barrier configured to prevent minority carriers photoexcited in the substrate from reaching a depletion region of the photodetector due to diffusion. Such a barrier thickness corresponding to the potential barrier may be at least 1 nm thick, at least 10 nm thick, or at least 100 nm thick, in various embodiments. Further, the potential barrier may include: a conduction band energy that is at least 0.01 times the band gap of the substrate above a conduction band energy of the band structure of the substrate surrounding the potential barrier, a conduction band energy that is at least 0.05 times the band gap of the substrate above a conduction band energy of the band structure of the substrate surrounding the potential barrier, a conduction band energy that is at least 0.1 times the band gap of the substrate above a conduction band energy of the band structure of the substrate surrounding the potential barrier, a conduction band energy that is at least 0.15 times the band gap of the substrate above a conduction band energy of the band structure of the substrate surrounding the potential barrier, a conduction band energy that is at least 0.2 times the band gap of the substrate above a conduction band energy of the band structure of the substrate surrounding the potential barrier, a conduction band energy that is at least 0.25 times the band gap of the substrate above a conduction band energy of the band structure of the substrate surrounding the potential barrier, a conduction band energy that is at least 0.5 times the band gap of the substrate above the conduction band energy of the band structure of the substrate surrounding the potential barrier, a conduction band energy that is at least 0.75 times the band gap of the substrate above the conduction band energy of the band structure of the substrate surrounding the potential barrier, a conduction band energy that is at least 1.0 times the band gap of the substrate above the conduction band energy of the band structure of the substrate surrounding the potential barrier, a valence band energy that is at least 0.01 times the band gap of the substrate above a valence band energy of the band structure of the substrate surrounding the potential barrier, a valence band energy that is at least 0.05 times the band gap of the substrate above a valence band energy of the band structure of the substrate surrounding the potential barrier, a valence band energy that is at least 0.1 times the band gap of the substrate above a valence band energy of the band structure of the substrate surrounding the potential barrier, a valence band energy that is at least 0.15 times the band gap of the substrate above a valence band energy of the band structure of the substrate surrounding the potential barrier, a valence band energy that is at least 0.2 times the band gap of the substrate above a valence band energy of the band structure of the substrate surrounding the potential barrier, a valence band energy that is at least 0.25 times the band gap of the substrate above a valence band energy of the band structure of the substrate surrounding the potential barrier, a valence band energy that is at least 0.5 times the band gap of the substrate above the valence band energy of the band structure of the substrate surrounding the potential barrier, a valence band energy that is at least 0.75 times the band gap of the substrate above the valence band energy of the band structure of the substrate surrounding the potential barrier, or a valence band energy that is at least 1.0 times the band gap of the substrate above the valence band energy of the band structure of the substrate surrounding the potential barrier.

In addition to or instead of a potential barrier, the band structure may include a potential well (e.g., separated from a potential barrier by a specified distance) configured to prevent minority carriers photoexcited in the substrate from reaching a depletion region of the photodetector due to diffusion. Such a well thickness corresponding to the potential well may be at least 1 nm thick, at least 10 nm thick, or at least 100 nm thick, in various embodiments. Further, the potential well may include: a conduction band energy that is at least 0.01 times the band gap of the substrate below a conduction band energy of the band structure of the substrate surrounding the potential well, a conduction band energy that is at least 0.05 times the band gap of the substrate below a conduction band energy of the band structure of the substrate surrounding the potential well, a conduction band energy that is at least 0.1 times the band gap of the substrate below a conduction band energy of the band structure of the substrate surrounding the potential well, a conduction band energy that is at least 0.15 times the band gap of the substrate below a conduction band energy of the band structure of the substrate surrounding the potential well, a conduction band energy that is at least 0.2 times the band gap of the substrate below a conduction band energy of the band structure of the substrate surrounding the potential well, a conduction band energy that is at least 0.25 times the band gap of the substrate below a conduction band energy of the band structure of the substrate surrounding the potential well, a conduction band energy that is at least 0.5 times the band gap of the substrate below the conduction band energy of the band structure of the substrate surrounding the potential well, a conduction band energy that is at least 0.75 times the band gap of the substrate below the conduction band energy of the band structure of the substrate surrounding the potential well, a conduction band energy that is at least 1.0 times the band gap of the substrate below the conduction band energy of the band structure of the substrate surrounding the potential well, a valence band energy that is at least 0.01 times the band gap of the substrate below a valence band energy of the band structure of the substrate surrounding the potential well, a valence band energy that is at least 0.05 times the band gap of the substrate below a valence band energy of the band structure of the substrate surrounding the potential well, a valence band energy that is at least 0.1 times the band gap of the substrate below a valence band energy of the band structure of the substrate surrounding the potential well, a valence band energy that is at least 0.15 times the band gap of the substrate below a valence band energy of the band structure of the substrate surrounding the potential well, a valence band energy that is at least 0.2 times the band gap of the substrate below a valence band energy of the band structure of the substrate surrounding the potential well, a valence band energy that is at least 0.25 times the band gap of the substrate below a valence band energy of the band structure of the substrate surrounding the potential well, a valence band energy that is at least 0.5 times the band gap of the substrate below the valence band energy of the band structure of the substrate surrounding the potential well, a valence band energy that is at least 0.75 times the band gap of the substrate below the valence band energy of the band structure of the substrate surrounding the potential well, or a valence band energy that is at least 1.0 times the band gap of the substrate below the valence band energy of the band structure of the substrate surrounding the potential well.

In still other embodiments, the substrate may include two or more materials. As such, the band structure may include a heterostructure. The heterostructure may include a first material with a band gap larger than a photon energy associated with the light emitted from the light source. Further, the first material may be present within the substrate at a first depth within the substrate to define a maximum absorption depth for the light emitted from the light source.

In some embodiments, block 1306 of the method 1300 may include coupling an anti-reflective layer to a second surface of the substrate (e.g., a surface of the substrate opposite the top surface of the device and/or opposite a top surface of the substrate). The anti-reflective layer may be configured to couple light passing through the substrate to an exterior of the substrate, thereby preventing reflections within the substrate of the light emitted from the light source so as to reduce photoexcitation of minority carriers within the substrate. The anti-reflective layer may include a graded-index anti-reflective coating, a quarter-wave optical layer, a Bragg grating, a diffraction grating, or an index-matched, passive substrate.

In yet other embodiments, block 1306 of the method 1300 may include polishing or planarizing a second surface of the substrate (e.g., a surface of the substrate opposite the top surface of the device and/or opposite a top surface of the substrate), thereby preventing reflections within the substrate of the light emitted from the light source so as to reduce photoexcitation of minority carriers within the substrate.

In still yet other embodiments, block 1306 of the method 1300 may include applying a band-reject optical filter over the top surface of the photodetector, thereby configuring the photodetector such that light emitted from the light source irradiates the photodetector through the band-reject optical filter. The band-reject optical filter may be configured to reduce intensity of one or more wavelengths (e.g., a range of wavelengths) of the light emitted from the light source, so as to reduce photoexcitation of minority carriers in the substrate based on the light emitted from the light source.

In even further embodiments, block 1306 of the method 1300 may include flip-chip bonding the substrate and the photodetector to one or more electrodes used to bias the photodetector such that the photodetector is arranged to detect light from the light source that irradiates a second surface of the substrate (e.g., a surface of the substrate opposite the top surface of the photodetector and/or opposite a top surface of the substrate). Additionally or alternatively, the substrate and the photodetector may be flip-chip bonded to one or more ROICs such that the photodetector is arranged to detect light from the light source that irradiates a second surface of the substrate (e.g., a surface of the substrate opposite the top surface of the photodetector and/or opposite a top surface of the substrate).

In some embodiments, the method 1300 may also include forming an additional photodetector within or on the substrate and electrically connecting the additional photodetector in series with the photodetector. The additional photodetector may be arranged to detect light emitted from the light source that irradiates a top surface of the additional photodetector.

Additionally, in various embodiments of the method 1300, one or more regions of the photodetector and/or the substrate may be defined using lithography. For example, one or more regions of the photodetector and/or the substrate may be defined using e-beam lithography, photolithography, nanoimprint lithography, interference lithography, chemical lithography, X-ray lithography, extreme ultraviolet lithography, dip-pen nanolithography, magnetolithography, or scanning probe lithography. Additionally or alternatively, one or more regions of the photodetector and/or the substrate may be defined using additive manufacturing (i.e., three-dimensional (3D) printing or stereolithography). Other additive or subtractive techniques could additionally or alternatively be used.

V. Conclusion

Multiple strategies of mitigating dark current are individually herein shown and described. It is understood that each strategy (e.g., method, device, or system) described herein could be combined with other strategies (e.g., methods, devices, or systems) described elsewhere or herein. Such combinations could be concurrently employed to further mitigate dark current, for example. In addition, it is understood that, in systems including multiple devices (e.g., multiple photodetectors, such as APDs, serially connected in a detector array, such as a SiPM), a single device may be modified to mitigate dark current, a plurality of devices may be modified to mitigate dark current, or all devices may be modified to mitigate dark current.

Further, many of the techniques of mitigating dark current in the present disclosure are shown and described with reference to photodetectors that include p-n junctions. It is also understood that at least some of the techniques could be applied to mitigate dark current in non-p-n-junction photodetectors. Even further, some of the techniques herein shown and described could be used to mitigate time decay for light detection in non-semiconductor photodetectors.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

The above detailed description describes various features and functions of the disclosed systems, devices, and methods with reference to the accompanying figures. In the Figures, similar symbols typically identify similar components, unless context dictates otherwise. The example embodiments described herein and in the Figures are not meant to be limiting. Other embodiments can be utilized, and other changes can be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

The particular arrangements shown in the Figures should not be viewed as limiting. It should be understood that other embodiments can include more or less of each element shown in a given Figure. Further, some of the illustrated elements can be combined or omitted. Yet further, an example embodiment can include elements that are not illustrated in the Figures.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

What is claimed is:

1. A method comprising:
   providing a device comprising:
      a light source comprising a laser;
      a substrate; and
      a photodetector coupled to the substrate,
         wherein the photodetector is arranged to detect a light signal emitted from the light source upon the light signal being reflected from one or more objects in an external environment and irradiating a top surface of the device;
   emitting the light signal from the light source; and
   mitigating dark current arising from minority carriers photoexcited in the substrate based on the light signal emitted from the light source.

2. The method of claim 1, wherein mitigating the dark current comprises emitting the light signal from the light source such that the light signal from the light source irradiates a bottom surface of the device.

3. The method of claim 1, wherein mitigating the dark current comprises modifying an operating temperature of the device.

4. The method of claim 1, wherein mitigating the dark current comprises modulating a wavelength of the light signal emitted from the light source.

5. The method of claim 1, wherein mitigating the dark current comprises modulating a power of the light signal emitted from the light source.

6. The method of claim 1, wherein mitigating the dark current comprises modulating a pulse frequency or duty cycle of the light signal emitted from the light source.

7. A method of manufacture comprising:
   providing a substrate;
   forming a photodetector within or on the substrate, wherein the photodetector is arranged to detect a light signal emitted from a light source comprising a laser upon the light signal being reflected from one or more objects in an external environment and irradiating a top surface of the photodetector; and
   performing a processing step that mitigates dark current arising from minority carriers photoexcited in the substrate based on the light signal emitted from the light source.

8. The method of claim 7, wherein performing the processing step that mitigates dark current comprises thinning the substrate by removing a portion of the substrate, thereby reducing a depth of the substrate to less than or equal to 100 times a diffusion length of a minority carrier within the substrate.

9. The method of claim 7, wherein performing the processing step that mitigates dark current comprises producing crystallographic defects within the substrate that allow for recombination of electrons and holes.

10. The method of claim 7, wherein performing the processing step that mitigates dark current comprises defining a band structure based on a material composition of the substrate and the photodetector.

11. The method of claim 10,
   wherein the band structure results in an electric field that extends beyond a depletion region of the photodetector based on a curvature of a conduction band or a valence band of the band structure beyond the depletion region of the photodetector, and
   wherein the electric field is configured to induce a drift current that accelerates minority carriers toward the depletion region of the photodetector when minority carriers are photoexcited in the substrate based on the light signal emitted from the light source.

12. The method of claim 10,
   wherein the band structure comprises a potential barrier, and
   wherein the potential barrier is configured to prevent minority carriers photoexcited in the substrate from reaching a depletion region of the photodetector due to diffusion.

13. The method of claim 10,
   wherein the band structure comprises a potential well, and
   wherein the potential well is configured to prevent minority carriers photoexcited in the substrate from reaching a depletion region of the photodetector due to diffusion.

14. The method of claim 10,
   wherein the substrate comprises a heterostructure, wherein the heterostructure comprises a first material, wherein the first material has a band gap larger than a photon energy associated with the light signal emitted from the light source, and wherein the first material is present within the substrate at a first depth within the substrate to define a maximum absorption depth for the light signal emitted from the light source.

15. The method of claim 7, further comprising flip-chip bonding the substrate and the photodetector to one or more electrodes used to bias the photodetector such that the photodetector is arranged to detect the light signal from the light source upon the light signal being reflected from the one or more objects in the external environment and irradiating a second surface of the substrate.

* * * * *